United States Patent
Tomic

(10) Patent No.: US 7,265,691 B2
(45) Date of Patent: Sep. 4, 2007

(54) MODELING FOR ENUMERATIVE ENCODING

(75) Inventor: Ratko V. Tomic, Lexington, MA (US)

(73) Assignee: 1stWorks Corporation, Norfolk, MA (US)

( * ) Notice: Subject to any disclaimer, the term of this patent is extended or adjusted under 35 U.S.C. 154(b) by 0 days.

(21) Appl. No.: 11/473,940

(22) Filed: Jun. 23, 2006

(65) Prior Publication Data

US 2006/0290539 A1  Dec. 28, 2006

Related U.S. Application Data

(60) Provisional application No. 60/737,073, filed on Nov. 15, 2005, provisional application No. 60/693,963, filed on Jun. 23, 2005.

(51) Int. Cl.
  *H03M 7/30* (2006.01)
(52) U.S. Cl. ............................. 341/87; 341/50
(58) Field of Classification Search ............... 341/50, 341/51, 55, 65, 67, 87, 106, 107
  See application file for complete search history.

(56) References Cited

U.S. PATENT DOCUMENTS

| | | | |
|---|---|---|---|
| 4,122,440 A | 10/1978 | Langdon, Jr. et al. | 340/347 |
| 4,286,256 A | 8/1981 | Langdon, Jr. et al. | 340/347 |
| 4,295,125 A | 10/1981 | Langdon, Jr. | 340/347 |
| 4,463,342 A | 7/1984 | Langdon, Jr. et al. | 340/347 |
| 4,467,317 A | 8/1984 | Langdon, Jr. et al. | 340/347 |
| 4,633,490 A | 12/1986 | Goertzel et al. | 375/122 |
| 4,652,856 A | 3/1987 | Mohiuddin et al. | 340/347 |
| 4,792,954 A | 12/1988 | Arps et al. | 371/48 |
| 4,891,643 A | 1/1990 | Mitchell et al. | 341/107 |
| 4,901,363 A | 2/1990 | Toyokawa | 382/56 |
| 4,905,297 A | 2/1990 | Langdon, Jr. et al. | 382/56 |
| 4,933,883 A | 6/1990 | Pennebaker et al. | 364/554 |
| 4,935,882 A | 6/1990 | Pennebaker et al. | 364/554 |
| 4,973,961 A | 11/1990 | Chamzas et al. | 341/51 |
| 4,989,000 A | 1/1991 | Chevion et al. | 341/107 |
| 5,023,611 A | 6/1991 | Chamzas et al. | 341/51 |
| 5,025,258 A | 6/1991 | Duttweiler | 341/107 |
| 5,045,852 A | 9/1991 | Mitchell et al. | 341/51 |
| 5,099,440 A | 3/1992 | Pennebaker et al. | 364/554 |
| 5,142,283 A | 8/1992 | Chevion et al. | 341/107 |
| 5,210,536 A | 5/1993 | Furlan | 341/107 |
| 5,272,478 A | 12/1993 | Allen | 341/107 |
| 5,307,062 A | 4/1994 | Ono et al. | 341/107 |

(Continued)

OTHER PUBLICATIONS

Fawcett, R.; Combination Coding: A New Entropy Coding Technique; Proceedings of 1996 Data Compression Conference, IEE; Mar. 31, 1996-Apr. 3, 1996, p. 434.*

(Continued)

*Primary Examiner*—Howard L. Williams
(74) *Attorney, Agent, or Firm*—Foley Hoag LLP

(57) ABSTRACT

Entropy encoders and decoders employ an entropy-pump operation. The entropy-pump operation includes classifying blocks of the input sequence's symbols in accordance with the probabilities of occurrence of those blocks' values. Entropy coding an output component that represents the sequence of classes to which the blocks belong tends to be profitable, because that component has an entropy density less than that of the input sequence. In contrast, little opportunity for compression tends to be lost by not entropy encoding an output component that represents the values of the blocks that belong to single class, because those values' probabilities of occurrence are similar.

4 Claims, 16 Drawing Sheets

U.S. PATENT DOCUMENTS

| | | | | |
|---|---|---|---|---|
| 5,309,381 | A | 5/1994 | Fukui | 364/715.02 |
| 5,311,177 | A | 5/1994 | Kimura et al. | 341/51 |
| 5,363,099 | A | 11/1994 | Allen | 341/107 |
| 5,404,140 | A | 4/1995 | Ono et al. | 341/107 |
| 5,406,282 | A | 4/1995 | Nomizu | 341/65 |
| 5,414,423 | A | 5/1995 | Pennebaker | 341/107 |
| 5,418,532 | A | 5/1995 | Lei | 341/107 |
| 5,546,080 | A | 8/1996 | Langdon, Jr. et al. | 341/107 |
| 6,298,160 | B1 | 10/2001 | Goertzen | 382/232 |
| 6,441,755 | B1 | 8/2002 | Dietz et al. | 341/50 |
| 6,621,428 | B1 | 9/2003 | Crane | 341/60 |
| 6,633,242 | B2 | 10/2003 | Brown | 341/50 |
| 6,894,628 | B2 | 5/2005 | Marpe et al. | 341/107 |
| 7,030,784 | B2 * | 4/2006 | Schouhamer Immink | 341/50 |

OTHER PUBLICATIONS

Oktem, L. et al.; Hierarchical enumerative coding of first-order Markovian binary sources; Electronics Letters□□vol. 35, Issue 23, Nov. 11, 1999 pp. 2003-2005.*

Pearlman, William A. "High Performance, Low-Complexity Image Compression." Electrical, Computer and Systems Engineering Dept., Rensselaer Polytechnic Institute, Troy, New York, Jul. 1997, pp. 1-13.

Tsai et al. "Stack-Run Coding for Low Bit Rate Image Communication." Electrical Engineering Department, University of California, Los Angeles, California, 1996 IEEE, pp. 681-684.

Moffat et al. "Arithmetic Coding Revisited." ACM Transactions on Information Systems, vol. 16, No. 3, Jul. 1998, pp. 256-294.

Bookstein, et al. "Is Huffman Coding Dead?" Computing, Springer-Verlag, Austria, vol. 50, 1993, pp. 279-296.

Lynch, Thomas J. "Sequence Time Coding for Data Compression." Proceedings Letters, Proceedings of the IEEE, Oct. 1966, pp. 1490-1491.

Davisson, L.D. "Comments on 'Sequence Time Coding for Data Compression.'" Proceedings Letters, Proceedings of the IEEE, Dec. 1966, p. 2010.

Öktem et al. "Hierarchical Enumerative Coding of Locally Stationery Binary Data." Electronics Letters, Aug. 19, 1999, vol. 35, No. 17, pp. 1428-1429.

Dai et al. "Binary Combinatorial Coding." Proceedings of the Data Compression Conference (DCC'03), 2003 IEEE, one page.

Myrvold et al. "Ranking and Unranking Permutations in Linear Time." Information Processing Letters, vol. 79, 2001, pp. 281-284.

Immink, Kees A. Schouhamer. "A Practical Method for Approaching the Channel Capacity of Constrained Channels." IEEE Transactions on Information Theory, vol. 43, No. 5, Sep. 1997, pp. 1389-1399.

Cover, Thomas M. "Enumerative Source Encoding." IEEE Transactions on Information Theory, vol. IT-19, No. 1, Jan. 1973, pp. 73-77.

Lawrence, John C. "A New Universal Coding Scheme for the Binary Memoryless Source." IEEE Transactions on Information Theory, vol. IT-23, No. 4, Jul. 1977, pp. 466-472.

Web search results on "Enumerative Coding", CiteSeer, http://citeseer.ist.psu.edu, Aug. 31, 2004, p. one of one.

Tjalkens, Tjalling J. "A Universal Variable-to-Fixed Length Source Code Based on Lawrence's Algorithm." IEEE Transactions on Information Theory, vol. 38, No. 2, Mar. 1992, pp. 247-253.

Imnink et al. "Effects of Floating Point Arithmetic in Enumerative Coding." Philips Research Laboratories, Prof. Holstlaan 6, 5656 AA Eindhoven, The Netherlands, Apr. 1997, pp. 1-6.

Schalkwijk, J. Pieter M. "An Algorithm for Source Coding." IEEE Transactions on Information Theory, vol. IT-18, No. 3, May 1972, pp. 395-399.

Rissanen, J.J. "Generalized Kraft Inequality and Arithmetic Coding." IBM J. Res. Develop., May 1976, pp. 198-203.

Printz, Harry. "Tutorial on Arithmetic Coding." Feb. 23, 1994.

Bird et al. "Arithmetic Coding with Folds and Unfolds." Advanced Functional Programming 4, Lecture Notes in Computer Science, Johan Jeuring and Simon Payton Jones, editors, 2003, pp. 1-26.

Öktem, Levent. "Hierarchical Emumerative Coding and Its Applications in Image Compression." Thesis, Signal Processing Laboratory of Tampere University of Technology, 1999, pp. i-123.

* cited by examiner

```
//-- Binary tree node structure typedef struct _node {     // Node data type (for binary
                           //   tree)
   _struct _node *left;    // pointer to left child X
                           // (0 if none)
   _struct _node *right;   // pointer to right child Y
                           // (0 if none)
   void *content;          // generic "content" pointer
                           // of this node
} NODE;

//-- Store node pointers into output buffer in postorder
// layout
int list_tree(NODE *root, NODE *out)
{ int i=0;
    visit(root,out,&i);    // recurse from given root
    return i;              // return # of nodes stored
                           // into out[]
}

//-- Postorder (bottom up) tree traversal void visit(NODE *parent, NODE *out, int *ip)
{
    if (parent->left)              // visit left subtree
                                   // if available
       visit(parent->left, out, ip);
    if (parent->right)             // visit right subtree
                                   // if available
       visit(parent->right,out,ip);
    out[*ip]=parent;               // output parent of
                                   //these subtrees
    ip[0]++;                       // advance output
                                   // position (count
}                                  // of node pointers stored)
```

FIG. 20

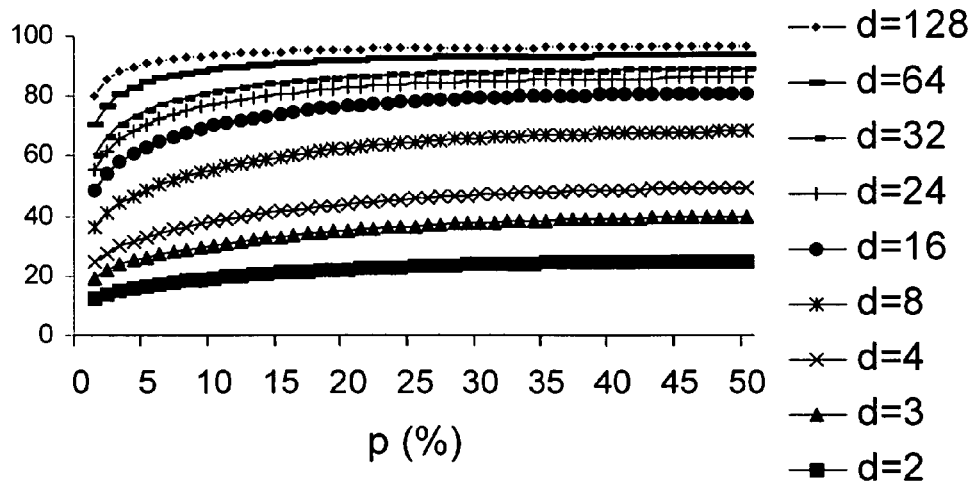

SINGLE-CYCLE EP4 PUMP EFFICIENCY

FIG. 21

```
//-- Convert FP number to nearest SWI

SWI fp2swi(double x,        // FP number to convert
           double Round)    // rounding: 0.0=down, 0.5
                            // nearest
                            // 0.99 round up
{ SWI Q;                    // SWI used for conversion
  double xm;                // FP mantissa
  int k=32;                 // scaling via exponent
                            //subtraction
    xm=frexp(x,&Q.e);       // separate FP mantissa & exp
    if (Q.e<=32)            // the whole x fits in 32 bits?
      k=Q.e;                // yes, use denormalized SWI
    Q.e-=k;                 // rescale FP via its exponent
    if (Round>0.5001)       // Check type of rounding
                            // requested
      Q.m=(dword)
   ceil(ldexp(xm,k));       // Rounding mantissa up
     else
      Q.m=(dword)
        floor(ldexp(xm,k)+Round);  // Round down/nearest
    return Q;               // return computed SWI
}
//                  Code C.2
```

FIG. 23

| k | GAP | QBC mant: exp | − | XBC mant: exp | = | DIFFERENCE dm16 | dm10 | ddm | EXTRA BITS |
|---|---|---|---|---|---|---|---|---|---|
| 1. |   | 00000400: 0 | − | 00000400: 0 | = | 0 | 0 | +0 | 0.00000E+000 |
| 2. |   | 0007FE00: 0 | − | 0007FE00: 0 | = | 0 | 0 | +0 | 0.00000E+000 |
| 3. |   | 0AA2AC00: 0 | − | 0AA2AC00: 0 | = | 0 | 0 | +0 | 0.00000E+000 |
| 4. | * | A9AB202F: 4 | − | A9AB1FF0: 4 | = | 3F | 63 | +63 | 3.19296E-008 |
| 5. | * | 87345DD0: 12 | − | 87345D73: 12 | = | 5D | 93 | +30 | 5.91488E-008 |
| 6. | * | B3647B52: 19 | − | B3647AA8: 19 | = | AA | 170 | +77 | 8.14891E-008 |
| 7. | * | CBD197B2: 26 | − | CBD196C9: 26 | = | E9 | 233 | +63 | 9.83029E-008 |
| 8. | * | CA6CE909: 33 | − | CA6CE801: 33 | = | 108 | 264 | +31 | 1.12149E-007 |
| 9. | * | B2872A13: 40 | − | B287290F: 40 | = | 104 | 260 | −4 | 1.25234E-007 |
| 10. | * | 8D912E6D: 47 | − | 8D912D8F: 47 | = | DE | 222 | −38 | 1.34848E-007 |
| 11. | * | CBE7A80C: 53 | − | CBE7A6B6: 53 | = | 156 | 342 | +120 | 1.44229E-007 |
| 12. | * | 8679F208: 60 | − | 8679F11D: 60 | = | EB | 235 | −107 | 1.50271E-007 |
| 13. | * | A391DDCD: 66 | − | A391DCAA: 66 | = | 123 | 291 | +56 | 1.52983E-007 |
| 14. | * | B8904D75: 72 | − | B8904C21: 72 | = | 154 | 340 | +49 | 1.58412E-007 |
| 15. | * | C22D26DF: 78 | − | C22D256D: 78 | = | 172 | 370 | +30 | 1.63855E-007 |
| 16. | * | BF54FD9B: 84 | − | BF54FC21: 84 | = | 17A | 378 | +8 | 1.69887E-007 |
| 17. | * | B1437283: 90 | − | B143711E: 90 | = | 165 | 357 | −21 | 1.73182E-007 |
| 18. | * | 9AF39FE6: 96 | − | 9AF39EA8: 96 | = | 13E | 318 | −39 | 1.76476E-007 |
| 19. | * | 80312159: 102 | − | 8031204F: 102 | = | 10A | 266 | −52 | 1.78433E-007 |
| 20. | * | C94D2663: 107 | − | C94D24BD: 107 | = | 1A6 | 422 | +156 | 1.80269E-007 |

FIG. 22A

| k | QBC mant: exp | | XBC mant: exp | | DIFFERENCE dm16 | dm10 | ddm | EXTRA BITS |
|---|---|---|---|---|---|---|---|---|
| 100. * | 821A287F: | 437 | 821A2748: | 437 | 137 | 311 | -228 | 2.05556E-007 |
| 101. * | 94C7BC40: | 440 | 94C7BADD: | 440 | 163 | 355 | +44 | 2.05181E-007 |
| 102. * | A84A1540: | 443 | A84A13AE: | 443 | 192 | 402 | +47 | 2.05411E-007 |
| 103. * | BC4DEC4A: | 446 | BC4DEA86: | 446 | 1C4 | 452 | +50 | 2.06411E-007 |
| 104. * | D07290F3: | 449 | D0728EFF: | 449 | 1F4 | 500 | +48 | 2.06266E-007 |
| 105. * | E44CB722: | 452 | E44CB4FF: | 452 | 223 | 547 | +47 | 2.06033E-007 |
| 106. * | F76A14F4: | 455 | F76A12A4: | 455 | 250 | 592 | +45 | 2.05755E-007 |
| 107. 84 | AAD39C: 459 | | 84AAD25F: | 459 | 13D | 317 | -275 | 2.05471E-007 |
| 108. * | 8CCE31C6: | 462 | 8CCE3076: | 462 | 150 | 336 | +19 | 2.05199E-007 |
| 109. * | 93E90A03: | 465 | 93E908A1: | 465 | 162 | 354 | +18 | 2.05807E-007 |
| 110. * | 99CB08F5: | 468 | 99CB0785: | 468 | 170 | 368 | +14 | 2.05762E-007 |
| 300. * | 9AED3564: | 857 | 9AED3435: | 857 | 12F | 303 | +51 | 1.68179E-007 |
| 301. * | BA52DCB3: | 858 | BA52DB48: | 858 | 16B | 363 | +60 | 1.67530E-007 |
| 302. * | DF087C50: | 859 | DF087A9D: | 859 | 1B3 | 435 | +72 | 1.67716E-007 |
| 303. * | 84DCEC45: | 861 | 84DCEB43: | 861 | 102 | 258 | -177 | 1.66982E-007 |
| 304. * | 9D8E6757: | 862 | 9D8E6624: | 862 | 133 | 307 | +49 | 1.67555E-007 |
| 305. * | B9F7D21B: | 863 | B9F7D0B1: | 863 | 16A | 362 | +55 | 1.67388E-007 |
| 306. * | DA7B6908: | 864 | DA7B6760: | 864 | 1A8 | 424 | +62 | 1.66880E-007 |
| 307. * | FF7D226E: | 865 | FF7D207F: | 865 | 1EF | 495 | +71 | 1.66605E-007 |
| 308. * | 94B0839F: | 867 | 94B0827F: | 867 | 120 | 288 | -207 | 1.66559E-007 |
| 309. * | AC44A26F: | 868 | AC44A122: | 868 | 14D | 333 | +45 | 1.66224E-007 |
| 310. * | C6A9FD63: | 869 | C6A9FBE3: | 869 | 180 | 384 | +51 | 1.66214E-007 |

FIG. 22B

| k | QBC | | XBC | | - | DIFFERENCE | | | EXTRA BITS |
|---|---|---|---|---|---|---|---|---|---|
| | GAP | mant: exp | mant: exp | | | dm16 | dm10 | ddm | |
| 500. | 9A2EDF6B: | 987 | 9A2EDE91: | 987 | = | DA | 218 | +10 | 1.21583E-007 |
| 501. | A142E8A6: | 987 | A142E7C4: | 987 | = | E2 | 226 | +8 | 1.20513E-007 |
| 502. * | A801E20F: | 987 | A801E124: | 987 | = | EB | 235 | +9 | 1.20280E-007 |
| 503. | AE5A82C4: | 987 | AE5A81D2: | 987 | = | F2 | 242 | +7 | 1.19355E-007 |
| 504. | B43C0A38: | 987 | B43C093F: | 987 | = | F9 | 249 | +7 | 1.18800E-007 |
| 505. | B9968940: | 987 | B9968841: | 987 | = | FF | 255 | +6 | 1.18153E-007 |
| 506. * | BE5B299D: | 987 | BE5B2898: | 987 | = | 105 | 261 | +6 | 1.17904E-007 |
| 507. | C27C7236: | 987 | C27C712C: | 987 | = | 10A | 266 | +5 | 1.17611E-007 |
| 508. | C5EE865F: | 987 | C5EE8552: | 987 | = | 10D | 269 | +3 | 1.16867E-007 |
| 509. * | C8A75E79: | 987 | C8A75D69: | 987 | = | 110 | 272 | +3 | 1.16567E-007 |
| 510. | CA9EF87E: | 987 | CA9EF76C: | 987 | = | 112 | 274 | +2 | 1.16284E-007 |

FIG. 22C

```
//-- Init exponents interpolation table define BM(b)   ((dword)1<<(b))  // 1-bit bitmask
define BML(b)  (BM(b)-1)   // low-part bitmask
#define XP32 12         // 12 fractional bits to keep top
                        // 20 bits for integer part
#define XP32ER   (-15.99999)  // roundoff
                              // adjustment for exp
                              // table (Ok to n=256K,
                              //    at least)
#define XP32M    BML(XP32)    // mask for
                              // fractional part int bcexp_start(int n,    // Maximum n
                          // for the table
           dword *expTbl) // Destination array
                          // for the fixed-point
                          // log(x!) entries
{ int i;
  double x;
  double *lf=lgf;    // lf=logs of factorials table
                     //    in FP double
  dword *t=expTbl;   // logs in fixed-point
                     //    format with the SWI bias if (!lf || !t)
      return 0;
    if (n>maxlg)
      return 0;
    t[0]=t[1]=0;
    for(i=2; i<=n+1; ++i)
      {
      x=lf[i];                // calculate 32-bit fixed-
                              //    point logs of factorials
      x=ldexp(x,XP32);        //    for C(n,k) exponents
      t[i]=(dword)floor(x+XP32ER);
      }
    return 1;
}
//                      CODE C.3
```

FIG. 24

```
//-- Computation of Quantized Binomial exponent define BCLOG(t,n,k,l)  ((t[n]-t[k]-t[l]))
                                // calc log of binomial
                                // via log(k!) table as
                                // log(C(n,k)) =
                                //   log(n!)-log(k!)
                                //     -log((n-k)!)

#define EXP32(t,n,k,l,b)       \ // Table int t[]
                               \//contains fixed-point
  { dword te,ti;               \ // log(x!)values
    te=BCLOG((t),(n),(k),(l));\
                               \// Compute fixed-point
                               \//    log bc(n,k)
    ti=te>>XP32;               \// Shift out fraction
                               \//    of fixed-
    (b).e=0;                   \//    point result
    if ((int)(ti-=32)>=0) \// check for
                               \//    denormalized SWI
      {                        \
        (b).e=ti;              \
        if ((te&XP32M)>30 ||   \// check for FP exp
                               \//    overflow
            (b).m<0xFF000000)  \//    and mantissa
                               \//    near 2^32
                               \//
          ++(b).e;             \// adjust computed
                               \//    SWI exponent
      }                        \//    on overflow
  }
//                    Code C.4
```

FIG. 25

MODELING FOR ENUMERATIVE ENCODING

CROSS-REFERENCE TO RELATED APPLICATIONS

The present application claims the benefit of U.S. Provisional Patent Application Ser. No. 60/693,963, which was filed on Jun. 23, 2005, by Ratko V. Tomic for Modeling for Quantized-Index Type Enumerative Encoding, and U.S. Provisional Patent Application Ser. No. 60/737,073, which was filed on Nov. 15, 2005, by Ratko V. Tomic for Encoder Employing Quantized Indexing, both of which are hereby incorporated by reference.

BACKGROUND OF THE INVENTION

1. Field of the Invention

The present invention is directed to entropy encoding and decoding, and it particularly concerns modeling employed for such encoding and decoding.

2. Background Information

Data compression usually includes multiple phases, where initial phases are more dependent on the specific data source. An encoder to be employed on sequences of symbols that represent values of pixels in an image, for example, may take the form of FIG. 1's decoder 10. The symbols may also include framing information, and the data may accordingly be subjected to, say, a two-dimensional discrete cosine transform 12. Some difference operation 14 may then be performed to express each value as a difference from one that came before.

This higher-level processing produces a sequence of symbols in which higher-level, domain- or source-specific regularities have been re-expressed as simple, generic (quantitative) regularities. Despite the differential operations, there is usually some skew in the resultant output's symbol distribution, and it is at this point that the entropy coding 16 may be employed to compress the data toward that sequence's entropy value.

In some cases, some measure of redundancy will then be re-introduced by, say, error-correction coding 18 in order to protect against corruption in a noisy transmission channel 20. If so, the result will be subjected to error-correction decoding 22 at the other end of the channel 20, and entropy decoding 24 will re-expand the compressed data to the form that emerged from the difference operation 14. An accumulator operation 26 will reverse the difference operation 14, and another discrete cosine transform 28 will complete the task of reconstituting the image. Again, the actual pixel-value data may be accompanied by framing, quantization, and other metadata.

As was stated above, the purpose of entropy coding is to compress the message length toward the message's entropy value, to approach optimal encoding. Optimal encoding is quantified as the message entropy, i.e. as the minimum number of bits per message averaged over all the messages from a given source. In the case of a source with a finite number of M distinct messages, all equally probable, the entropy H (per message) is $\log_2(M)$ bits; i.e., no encoding can do better than sending a number between 0 and M−1 to specify the index of a given message in the full list of M messages. (In the remainder of the specification, $\log_2 x$ will be expressed simply as "log x.")

More often, though, messages' probabilities re not equal. A common entropy-coding scenario is the one in which messages are sequences of symbols selected from an alphabet A of R symbols $\alpha_1, \alpha_2, \ldots \alpha_R$, generated with probabilities $p_1, p_2, \ldots p_R$ that are not in general equal. The n-character message entropy is then:

$$H = n \sum_{i=1}^{R} p_i \log(1/p_i) \tag{1}$$

This value is less than log M if the probabilities are not equal, so some savings can result when some messages are encoded in fewer bits than others. Taking advantage of this fact is the goal of entropy coding.

The two types of general entropy-coding algorithms that are most popular currently are Huffman coding and arithmetic coding. The Huffman algorithm assigns to each symbol $\alpha_i$ a unique bit string whose length is approximately $\log(1/p_i)$ bits, rounded up or down to the next whole number of bits. The up/down rounding choice of each $\log(1/p_i)$ depends on all the $p_i$'s and is made by using the Huffman tree-construction algorithm. If all the symbol probabilities happen to be of the form $\frac{1}{2^k}$, where k is a positive integer, the resultant encoding minimizes the average message length.

The principal weakness of the Huffman code is its sub-optimality in the case of more-general probabilities (those not of the form $\frac{1}{2^k}$). Huffman coding is especially inefficient when one symbol has a probability very close to unity and would therefore need only a tiny fraction of one bit; since no symbol can be shorter than a single bit, the code length can exceed the entropy by a potentially very large ratio. While there are workarounds for the worst cases (such as run-length codes and the construction of multi-character symbols in accordance with, e.g., Tunstall coding), such workarounds either fall short of optimality or otherwise require too much computation or memory as they approach the theoretical entropy.

A second important weakness of the Huffman code is that its coding overhead increases, both in speed and memory usage, when the adaptive version of the algorithm is used to track varying symbol probabilities. For sufficiently variable sources, moreover, even adaptive Huffman algorithm cannot build up statistics accurate enough to reach coding optimality over short input-symbol spans.

In contrast to Huffman coding, arithmetic coding does not have the single-bit-per-symbol lower bound. As a theoretical, albeit impractical, method, arithmetic coding goes back to Claude Shannon's seminal 1948 work. It is based on the idea that the cumulative message probability can be used to identify the message. Despite minor improvements over the decades, its fatal drawback was the requirement that its arithmetic precision be of the size of output data, i.e., divisions and multiplications could have to handle numbers thousands of bits long. It remained a textbook footnote and an academic curiosity until 1976, when an IBM researcher (J. Rissanen, "Generalised Kraft Inequality and Arithmetic Coding," *IBM J. Res. Dev.* 20, 198-203, 1976) discovered a way to make the algorithm's arithmetic work within machine precision (e.g., 16, 32, or 64 bits) practically independently of the data size, with only a minor compression-ratio penalty for the truncated precision. (That technique retained only a log(n) dependency on the data size n if absolutely optimal compression was required.) Over the following decades, the algorithm evolved rapidly, chiefly through speed improvements (which are obtained in arrangements such as that of IBM's Q-coder with only a small additional loss of compression efficiency) and faster and more-flexible adaptive variants. By the mid-1990's the arithmetic coder had replaced the Huffman algorithm as the entropy coder of choice, especially in more-demanding applications. But arithmetic coding is like Huffman coding in that its performance suffers when source statistics change rapidly.

Theoretically, the slow-adaptability problem that these two popular entropy-encoding techniques share can be overcome by a relatively obscure compression technique known as "enumerative coding." The roots of enumerative coding extend farther into the past than modem information theory, going back to the enumerative combinatorics of the Nineteenth and early Twentieth Centuries. And using combinatorial objects for ranking, as conventional enumerative encoding does, had actually been part of common computer-programming folklore for over a decade in 1966, when Lynch (T. J. Lynch, "Sequence Timecoding for Data Compression," *Proc. IEEE* vol. 54, 1490-1491, October 1966) and, independently, Davisson (L. D. Davisson, "Comments on 'Sequence Time Coding for Data Compression,'" *Proc. IEEE* vol 54, 2010, December 1966) used the same number representation and formulas to encode "sequence times" for digitized data samples, i.e., presented what is now referred to as enumerative encoding.

Conceptually, enumerative encoding lists all messages that meet a given criterion and optimally encodes one such message as an integer representing the message's index/rank within that list. In words, an example would be, "Among the 1000-bit sequences that contain precisely forty-one ones (and the rest zeros), the sequence that this code represents is the one with whose pattern we associate index 371." That is, the example encoding includes both an identification of the source sequence's symbol population, (41 ones out of 1000 in the example), and an index (in that case, 371) representing the specific source sequence among all those that have the same symbol population.

Since the number of patterns for a given population can be quite large, it would not be practical to arrive at a significant-length sequence's pattern index by storing associations between indexes and patterns in a look-up table. Instead, one would ordinarily arrive at any given source pattern's index algorithmically, and the index-determining algorithm would typically be based on the value that the sequence represents. In accordance with one such indexing approach, for example, the prior example may alternatively be expressed in words as, "The sequence that this code represents is the $371^{st}$-lowest-valued 1000-bit sequence that contains precisely 41 ones," and it would therefore be possible to determine the index algorithmically.

Consider the seven-bit sequence 1001010, for example, i.e., one of the sequences that has three ones out of seven bits. The task is to determine an index that uniquely specifies this sequence from among all that have the same population, i.e., from among all seven-bit sequences that have three ones and four zeros. In accordance with an indexing scheme in which indexes increase with the sequence's value and the more-significant bits are those to the left, the index can be computed by considering each one-valued bit in turn as follows. Since the example sequence's first bit is a one, we know that its value exceeds that of all same-population sequences in which all three ones are in the remaining six bits, so the index is at least as large as the number of combinations of three items chosen from six, i.e., 6!/(3!*3!), and we start out with that value. Out of all same-population sequences that similarly start with a one bit, the fact that the example sequence has a one in the fourth bit position indicates that its index exceeds those in which both remaining ones are somewhere in the last three bit positions, so the index is at least as large as the result of adding the number of such sequences to the just-mentioned number in which all three are in the last six positions. By following that reasoning, the index I can be determined in accordance with:

$$I = \binom{6}{3} + \binom{3}{2} + \binom{1}{1} = 20 + 3 + 1 = 24.$$

I.e., the index can be determined by summing combinatorially determined add-on values.

Now, that index requires five bits, and it would take three bits to specify the population value, so the resultant eight bits exceeds the length of the (seven-bit) source sequence. But it is apparent that the comparison of the source-sequence length with the index length would be more favorable for a more-skewed population in a longer sequence. And the number of bits required for the "side information" that specifies the population increases only as the logarithm of the sequence length. Over a group of such sequences, moreover, that side information can itself be compressed. So the resultant code length approaches source entropy as the source-sequence length becomes large.

The combinatorial values used as "add-on" terms in the index calculation can be expensive to compute, of course, but in practice they would usually be pre-computed once and then simply retrieved from a look-up table. And it is here that enumerative coding's theoretical advantage over, say, arithmetic coding is apparent. Just as combinatorial values are successively added to arrive at the conventional enumerative code, successive "weight" values are added together to produce an arithmetic code. And arithmetic coding's weights can be pre-computed and retrieved from a look-up table, as enumerative coding's combinatorial values can. In arithmetic coding, though, the values of such add-on terms are based on an assumption of the overall sequence's statistics, and the arithmetic code's length will approach the source sequence's theoretical entropy value only if statistics of the source sequence to be encoded are close to those assumed in computing the add-on terms. To the extent that source statistics vary, the look-up table's contents have to be recomputed if near-optimal compression is to be achieved, and this imposes a heavy computational burden if the source statistics vary rapidly. In contrast, enumerative coding's table-value computation is not based on any assumption about the sequence's overall statistics, so it can approach theoretical entropy without the computation expense of adapting those values to expected statistics.

Enumerative coding has nonetheless enjoyed little use as a practical tool. The reason why can be appreciated by again considering the example calculation above. The sequence length in that example was only seven, but the lengths required to make encoding useful are usually great enough to occupy many machine words. For such sequences, the partial sums in the calculation can potentially be that long, too. The calculation's addition steps therefore tend to involve expensive multiple-word-resolution additions. Also, the table sizes grow as $N^3$, where N is the maximum block size (in bits) to be encoded, yet large block sizes are preferable, because using smaller block sizes increases the expense of sending the population value.

Arithmetic coding once suffered from the same drawback, but the Rissanen approach mentioned above solved the problem. Basically, Rissanen employed add-on values that could be expressed as limited-precision floating-point numbers. For example, the resolution might be so limited that all of each add-on value's bits are zeros except the most-significant ones and that the length of the "mantissa" that contains all of the ones is short enough to fit in, say, half a machine word. Even if such an add-on value's fixed-point expression would be very long and that value is being added to a partial sum that potentially is nearly as long, the resolution of the machine operation used to implement that addition can be small, since the change if any in the partial sum occurs only in a few most-significant bits. Rissanen recognized that add-on values meeting such resolution limitations could result in a decodable output if the total of the symbol probabilities assumed in computing them is less than unity by a great enough difference and the values thus computed are rounded up meet the resolution criterion. (The difference from unity required of the symbol-probability total depends on the desired resolution limit.)

Still, the best-compression settings of modern implementations require multiplications on the encoder and divisions on the decoder for each processed symbol, so they are slower than a static Huffman coder, especially on the decoder side. (The particular degree of the speed penalty depends on the processor.) By some evaluations, moreover, the arithmetic coder compresses even less effectively than the Huffman coder when its probability tables fail to keep up with the source probabilities or otherwise do not match them. So it would be desirable to find some type of the limited-resolution version of enumerative encoding, i.e., if the add-on terms added together to arrive at the enumerative-encoding index could be rounded in such a fashion as eliminate the need for high-resolution additions and to be expressible in floating-point formats so as to limit table-entry sizes.

For a long time, though, this did not appear possible; it turns out that the indexes that result from simply rounding the conventional path-count values to such low-resolution values are not always unique. But U.S. patent application Ser. No. 11/015,894, which was filed on Dec. 17, 2004, by Ratko V. Tomic for Fast, Practically Optimal Entropy Coding and is hereby incorporated by reference ("my previous application"), discloses how to select the add-on values in a way that both satisfies the short-mantissa requirement and produces a decodable result-and still achieves nearly the same degree of compression that the conventional binomial values do. Instead of using the "top-down" approach rounding up the closed-form binomial-coefficient formula in accordance with $N(n,k)=\lceil C(n,k)\rceil_R \equiv \lceil n!/[(n-k)!k!]\rceil_R$, where R is some conveniently small integer and $\lceil x \rceil_R$ means rounding x up to a floating-point value whose mantissa can be expressed in R bits, I proposed to use a "bottom-up" approach, in which I modify the recursive binomial-coefficient formula $C(n,k)=C(n-1, k-1)+C(n-1, k-1)$ to arrive at $N(n,k)=\lceil N(n-1, k-1)+N(n-1, k-1)\rceil_R$, where $N(1,k)=C(1,k)$.

The amount of computational effort required by that entropy-coding approach for a given source message received by the composite encoder depends on the "modeling" that precedes it. The initial encoding steps shown above can be thought of as high-level types of modeling, whose applicability is limited to a narrow range of applications. There are also lower-level modeling operations, of which the drawing shows no examples, whose ranges of applicability tend to be broader.

SUMMARY OF THE INVENTION

I have developed new types of such low-level modeling that are well suited to use with entropy encoding and particularly enumerative encoding. These types of modeling involve producing from an input symbol sequence a pair of components by dividing the input sequence into a sequence blocks, classifying the blocks, generating as one of the components an output that represents the sequence of classes to which those blocks belong as a result, and generating as the other component an output a sequence of indexes that identify respective blocks' values uniquely within their classes but not necessarily among all possible block values. This component can be thought of comprising a separate subcomponent for each of the classes, i.e., a component that includes only the indexes for the blocks in that class.

My new types of modeling take advantage of this class/index output division in various ways. For example, one approach so classifies the blocks that all blocks belonging to the same class have the same or similar probabilities of occurrence. The result is an "entropy pump," where the class-based component's entropy density tends to be lower than the input sequence's but the index-based subcomponents' tend to be higher. As a consequence, it will often be the case that very little redundancy penalty results from dispensing with (the typically computation-intensive operation of) entropy encoding the index-based component; most of the available compression value can be realized by entropy encoding only the class-based component. So a given level of compression can be achieved at a computation cost much lower than would result if the entropy pump were not employed.

BRIEF DESCRIPTION OF THE DRAWINGS

FIG. 20 is a listing of compiler code that could be used for setting the order in which encoder components should be placed.

FIG. 21 is a graph that compares single-cycle pumping efficiencies of various block lengths.

FIGS. 22A, 22B, and 22C together form a table that compares exact binomial coefficients with corresponding addends used for quantized indexing.

FIG. 23 is a listing of compiler code that could be used to convert a floating-point number to a corresponding floating-window integer.

FIG. 24 is a listing of compiler code that could be used to compute log-of-factorial values.

FIG. 25 is a listing of compiler code that could be used to compute a sliding-window-integer exponent for use in quantized indexing.

DETAILED DESCRIPTION OF AN ILLUSTRATIVE EMBODIMENT

Figure 1:
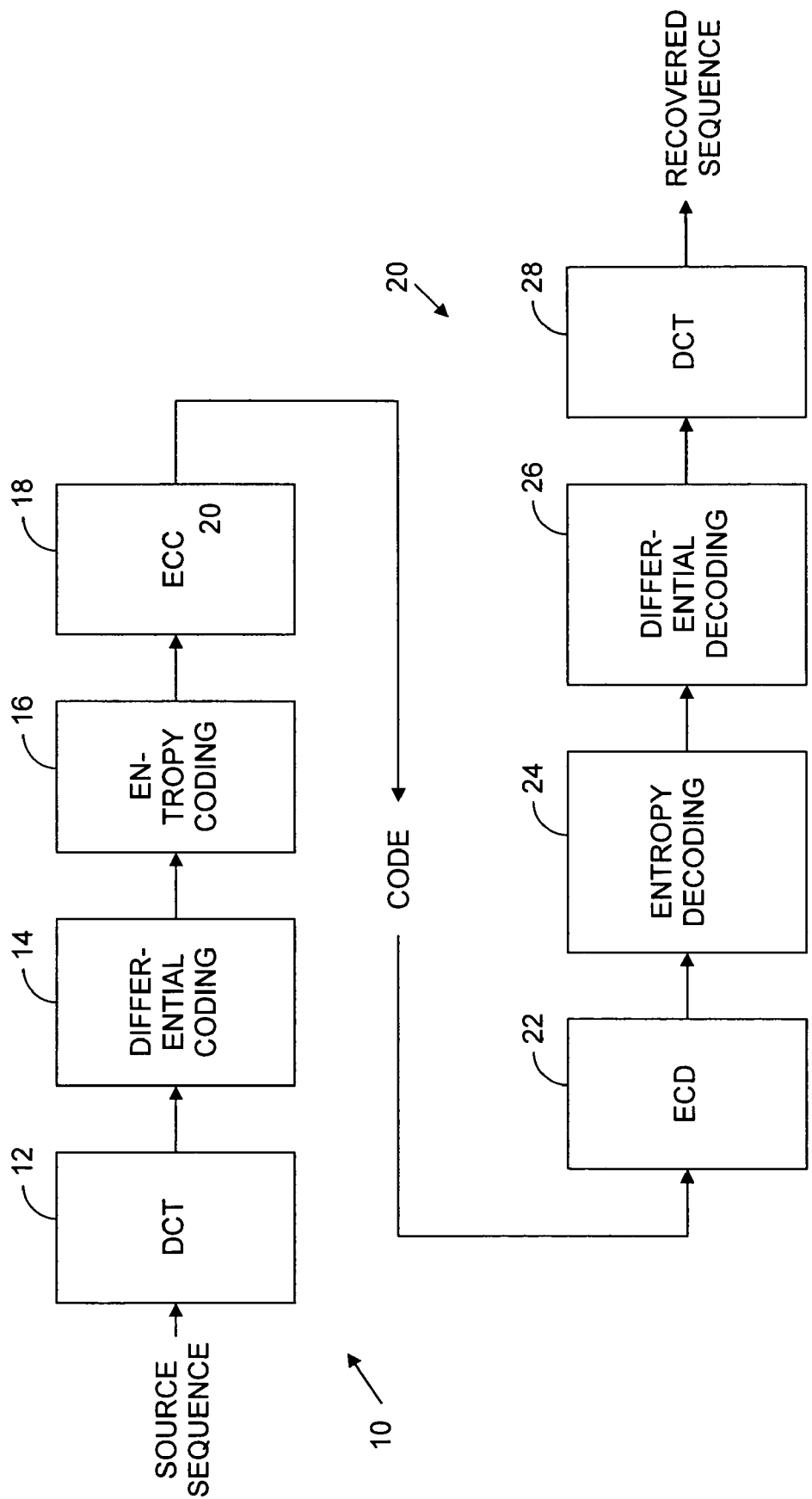
FIG. 1, described above, is a block diagram that illustrates one type of environment in which entropy encoding may be encountered.

For the sake of explanation, it is convenient to represent the operations of the modeling approaches below in a manner similar to that in which FIG. 1 does, i.e., by separate blocks representing successive operations. And, in some environments, those blocks could represent respective different circuits. In many cases, though, some or all would be embodied in the same circuitry; all of the encoding and/or decoding circuitry could, for example, be implemented in the same computer system, such as the one that FIG. 2 represents.

In that drawing, a computer system 30 includes a microprocessor 32. Data that the microprocessor 32 uses, as well as instructions that it follows in operating on those data, may reside in on-board cache memory or be received from further cache memory 34, possibly through the mediation of a cache controller 36. That controller can in turn receive such data and instructions from system read/write memory ("RAM") 38 through a RAM controller 40 or from various peripheral devices through a system bus 42. Alternatively, the instructions may be obtained from read-only memory ("ROM") 44, as may some permanent data, such as the index-volume values that quantized-indexing or other enumerative-encoding approaches employ.

The processor may be dedicated to encoding and/or decoding, or it may additionally execute processes directed to other functions, and the memory space made available to the encoding process may be "virtual" in the sense that it may actually be considerably larger than the RAM 38 provides. So the RAM's contents may be swapped to and from a system disk 46, which in any case may additionally be used instead of a read-only memory to store instructions and permanent data. The actual physical operations performed to access some of the most-recently visited parts of the process's address space often will actually be performed in the cache 34 or in a cache on board microprocessor 32 rather than in the RAM 38. Those caches would swap data and instructions with the RAM 38 just as the RAM 38 and system disk 46 do with each other.

Figure 2:
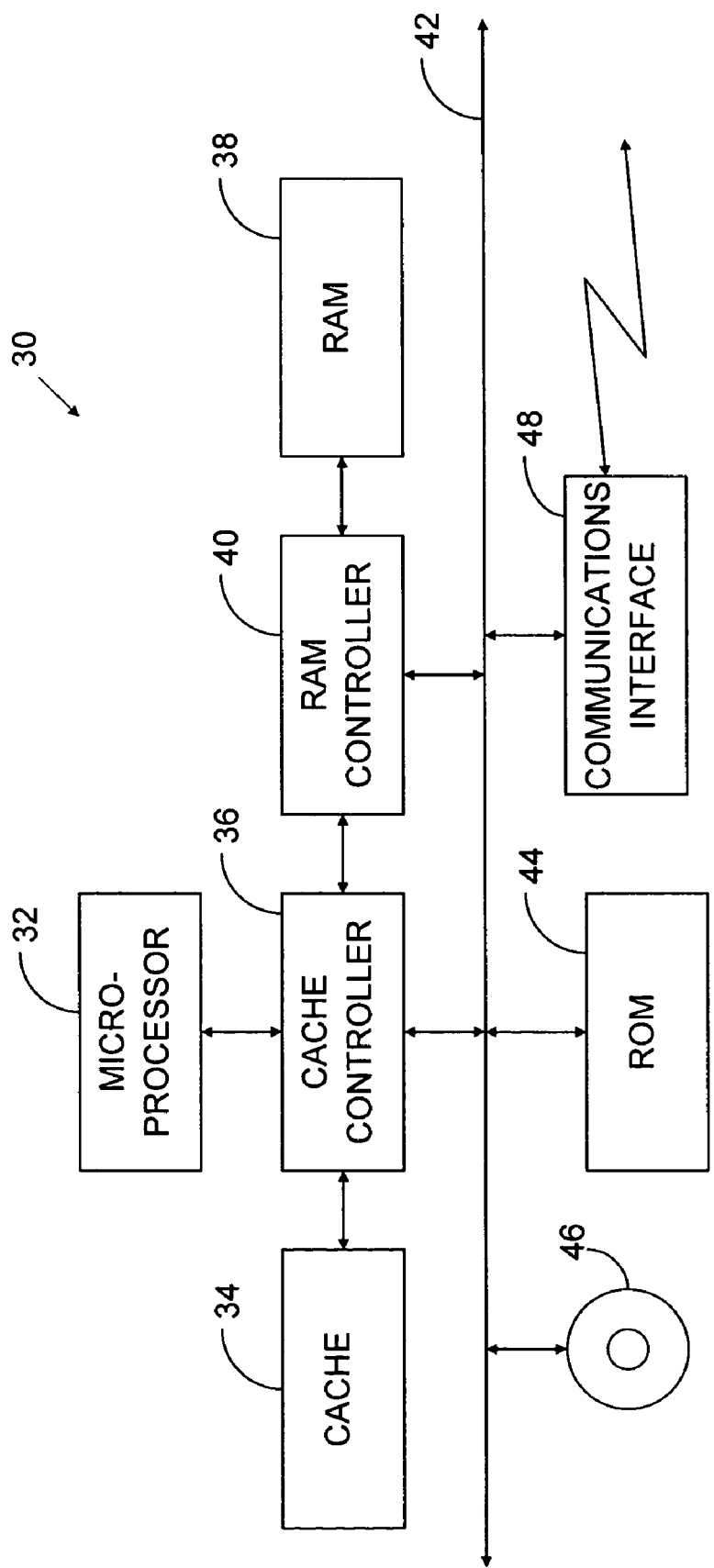
FIG. 2 is a block diagram of one type of computer system that could be used to perform encoding and/or decoding.

In any event, the ROM 44 and/or disk 46 would usually provide persistent storage for the instructions that configure such a system as one or more of the constituent encoding and/or decoding circuits of FIG. 1, but the system may instead or additionally receive them through a communications interface 48, which receives them from a remote server system. The electrical signals that typically carry such instructions are examples of the kinds of electromagnetic signals that can be used for that purpose. Others are radio waves, microwaves, and both visible and invisible light.

Of course, few computer systems that implement the present invention's teachings will be arranged in precisely the manner that FIG. 2 depicts, and encoders are not necessarily implemented in general-purpose microprocessors or signal processors. This is true of encoders in general as well as those that implement the present invention's teachings, which we now describe by way of illustrative embodiments.

As was mentioned above, we are primarily concerned here with low-level modeling operations. Such modeling can be performed directly on the raw input or be used in conjunction with higher-level operations such as those that FIG. 1 depicts. For present purposes, we will refer simply to a "source," with the understanding that the source may actually be other modeling or other encoding operations. And the first embodiment to be discussed is one that is best suited to such sources that are binary order-0-Markov (Bernoulli) sources, i.e., sources of sequences of symbols selected from a two-symbol alphabet in which the probability of a given symbol is considered to be independent of which symbols precede or follow it.

Several of the examples that follow exemplify what I refer to as an "entropy-pump" ("EP") approach, because they take an input of intermediate average entropy and produce multiple output components, some of which have an average entropy higher than the input's, others of which have average entropy densities that are lower. The beneficial result is that the entropy-encoding operation that follows it can ignore the higher-average-entropy components, which they cannot compress much, and restrict its attention to the lower-entropy components, which they can.

A binary Bernoulli source is characterized by probabilities of symbols 1 and 0, denoted as $P(1) \equiv p$ and $P(0) \equiv q = 1-p$, that are independent of the symbol's environment, i.e, of what symbols precede and/or follow it. Unless noted otherwise, we will use convention $p \leq q$, so we have $0 \leq p \leq \frac{1}{2} \leq q \leq 1$. The input sequence being encoded is $S[n] = a_1 a_2 a_3 \ldots a_n$, where $a_t$ are symbols 0 or 1. We denote count of ones in $S[n]$ as k and count of zeros as $l = n-k$.

The Shannon entropy $H(S)$ of the input sequence $S[n]$ is given by:

$$H(S) = n \cdot [p \cdot \log(1/p) + q \cdot \log(1/q)] \equiv n \cdot h(p), \tag{1}$$

where $h(p) \equiv p \log(1/p) + q \log(1/q)$ is the average entropy per symbol. Note that $H(S)$ does not include the cost of transmitting the $S[n]$ parameters p and n. In our output-size comparisons with $H(S)$, therefore, we will not include cost of transmission of p and n even though the encoder and decoder need to know these parameters.

EP1: Single Cycle, Two Symbols/Block

In the first example, which we refer to as "EP1," the encoder and decoder share a "virtual dictionary" partitioned into "enumerative classes." The virtual dictionary D is defined as a set of all two-symbol sequences:

$$D=\{00, 01, 10, 11\} \quad (2)$$

The enumerative classes into which dictionary D is partitioned are disjoint subsets of D, each of which contains equiprobable sequences only) as follows:

$$D=E_0 \cup E_1 \cup E_2, \quad (3)$$

where the enumerative classes $E_0$, $E_1$ and $E_2$ are defined as:

$$E_0=\{00\} \quad (4a)$$

$$E_1=\{11\} \quad (4b)$$

$$E_2=\{01, 10\} \quad (4c)$$

EP1 Encoding

Figure 3:
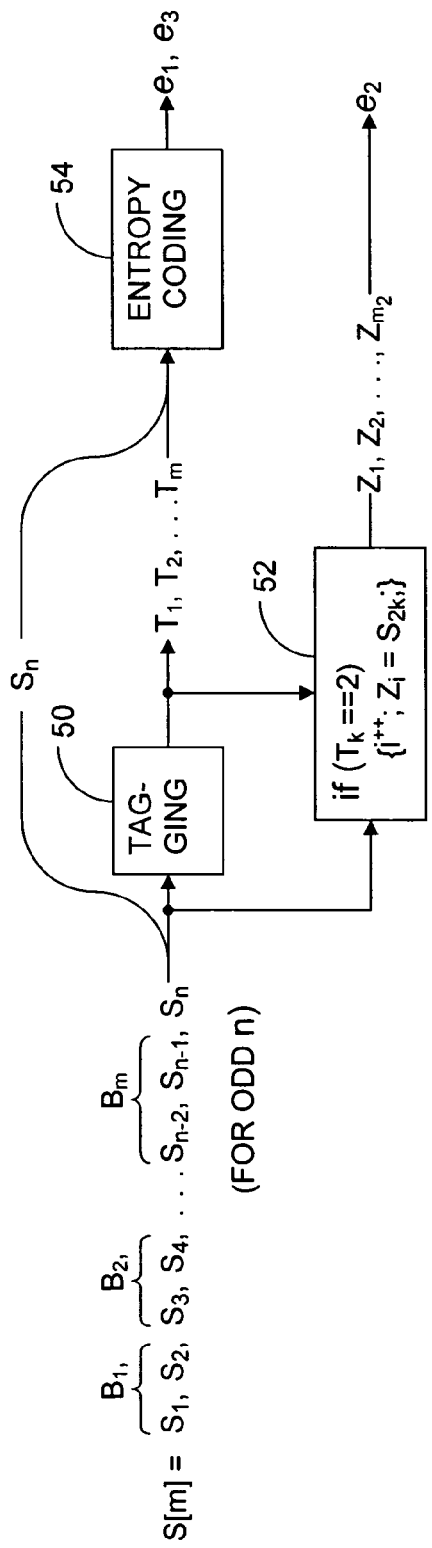
FIG. 3 is a block diagram that illustrates an encoder that includes a single-cycle entropy pump suitable for a Bernoulli source of binary symbols.

The input S[n] to be encoded is segmented into $m=\lfloor n/2 \rfloor$ two-symbol blocks as: $B=B_1, B_2, \ldots, B_m$. (Here "$\lfloor n/2 \rfloor$" means the largest integer less than or equal to n/2. For odd sequence lengths n, the last, single-bit symbol is processed separately from the blocks $B_j$ in accordance with a convention agreed to in advance by encoder and decoder.) FIG. 3's block 50 represents generating from these blocks a corresponding sequence of class tags $T[m] \equiv T = T_1 T_2 \ldots T_m$, where each $T_j$ is a symbol 0, 1, or 2 identifying the enumerative class $E_c$ (c=0, 1, 2) to which block $B_j$ belongs. T is therefore a sequence in a ternary alphabet (i.e., an alphabet in which the number $\alpha$ of symbols is three) defined as follows:

$$B_j \in E_c \Rightarrow T_j = c \text{ where: } c=0, 1 \text{ or } 2 \text{ and } j=1,2, \ldots m. \quad (5)$$

The probabilities $p_c$ that a given tag $T_j$'s value is c, where c is 0, 1 and 2, are:

$$p_0 \equiv P(T_j=0) \equiv q^2 \text{ and } q_0=1-p_0 \quad (6a)$$

$$p_1 \equiv P(T_j=1) \equiv p^2 \text{ and } q_1=1-p_1 \quad (6b)$$

$$p_2 \equiv P(T_j=2) \equiv 2pq \text{ and } q_2=1-p_2 \quad (6c)$$

We denote the counts of tags $T_j$ in T with values c=0, 1, or 2 as:

$$m_0 \equiv \text{Count\_of }(T_j=0), \overline{m}_0 \equiv m-m_0 \quad (7a)$$

$$m_1 \equiv \text{Count\_of }(T_j=1), \overline{m}_0 \equiv m-m_0 \quad (7b)$$

$$m_2 \equiv \text{Count\_of }(T_j=2), \overline{m}_0 \equiv m-m_0 \quad (7c)$$

Counts mc therefore satisfy the following constraints:

$$m_0+m_1+m_2=m \equiv \lfloor n/2 \rfloor \quad (8a)$$

$$0 \leq m_c \leq m \text{ for } c=0,1,2 \quad (8b)$$

From eqs. (6)-(8) it follows that the probability of a given $m_c$'s having a value $\mu$ (where $0 \leq \mu \leq m$) is given by the binomial distribution:

$$P(m_c = \mu) = p_c^\mu q_c^{m-\mu} \binom{m}{\mu} \quad (9)$$

An operation that block 52 represents can be thought of as computing each block $B_j$'s index within its enumerative class. However, since classes $E_0$ and $E_1$ contain only a single element each, all enumerative indices of blocks that belong to these classes are 0, so no index output is actually computed for such blocks.

On the other hand, class $E_2$ contains two equally probable elements, so its index requires one bit per block from $E_2$. In this case, in which there are only two elements, the example assigns index values 0 and 1 to the $E_2$ elements 10 and 01, respectively; in this case, that is, the block index is simply the block's last bit.

Because the example demonstrates principles that can be employed when there are enumerative classes that have more members, we digress to note that this embodiment's indexing scheme is an example of what my previous application referred to as "colex ranking," where each possible one-, two- . . . , and n-bit sequence that is an element of the class being enumerated is assigned an index such that the index of any k-bit sequence whose terminal bit is 0 is the same as that of that k-bit sequence's k-1-bit prefix, and the index of any k-bit sequence whose terminal bit is 1 is the sum of its prefix's index and a "volume" value greater than the highest index of a k-bit sequence that has (1) the same number of ones as that k-bit sequence but (2) one less zero.

In any event, we denote the sequence of $m_2$ index values (bits) for all $m_2$ blocks $B_j \in E_2$ as $Z[m_2]$.

The encoder output contains three components referred to below as e1, e2, and e3. (We are assuming here that the encoder and decoder have "agreed" on source parameter p and the source sequence S[n]'s length n. In embodiments in which that is not the case, the output would also include components that represent those values.) Component e1 results from an operation, represented by FIG. 3's block 54, that encodes the tag sequence $T[m] \equiv T$. As was stated above, T is a sequence of m symbols in a ternary ($\alpha=3$) alphabet with known symbol probabilities (given by eqs. (6a)-(6c)) and a known symbol count $m=\lfloor n/2 \rfloor$.

The block-54 operation is some type of entropy encoding, such as arithmetic coding, enumerative coding, run-length coding, etc. If enumerative encoding is used, it will usually be preferable as a practical matter to employ the quantized-indexing variety, of which my previous application gives examples. Particularly appropriate in this regard would be binary decomposition or direct multinomial enumeration, which that application's paragraphs 135-166 describe.

T's average output length from an optimal coder is $L(T)=m \cdot \Sigma_c p_c \log(1/p_c)$, which after substitution of the $p_c$ values given in eqs. (6) yields L(T) in terms of p and q as:

$$L(T) = m[p^2 \log(1/p^2) + q^2 \log(1/q^2) + 2pq \log(1/2pq)] \quad (10)$$

$$= 2m[p\log(1/p) + q\log(1/q)] - 2mpq$$

$$= H(S) - 2mpq - (n \ \& \ 1) \cdot h(p),$$

where the factor (n & 1), i.e., the bitwise AND of n's binary representation and a single 1 bit, results from identity 2m+(n & 1)=n.

The second component, e2, is the $m_2$-bit index sequence $Z[m_2]$ produced in the above-mentioned operation that FIG. 3's block 52 represents. Its two possible indexes 0 and 1 are equally probable, so it requires no further encoding. The average length of this sequence $L(S_2)$ obtained by averaging $m_2$ values via the binomial distribution (eq. (9), c=2) is:

$$L(Z) = \sum_{\mu=0}^{m} \mu p_2^\mu q_2^{m-\mu} \binom{m}{\mu} = mp_2 = 2mpq \quad (11)$$

The third component, e3, is the residual bit of S[n] that for odd values of n belongs to no block $B_j$. In this first, single-cycle embodiment, the cost of sending that single bit explicitly would be negligible, so some embodiments will do just that. But the cost can become significant in multi-cycle embodiments, so we here consider encoding it optimally.

The cost L(1) of transmitting the residual bit, encoded by an optimal entropy coder (such as arithmetic coder or a quantized-indexing or other enumerative encoder) is:

$$L(1)=(n \ \& \ 1) \cdot h(p), \tag{12}$$

where the factor (n & 1) has values 1 for odd n and 0 for even n. Of course, if this bit were the sole item being transmitted in a whole number of bits, the cost L(1) would be rounded to the next whole bit, yielding:

$$L(1)=(n \ \& \ 1) \tag{13}$$

Since we are sending multiple items, this component-wise whole-bit rounding is not necessary. In the FIG. 3 embodiment, for example, the additional bit is encoded together with the $e_1$ component. So we can use the optimal value given in eq. (12). For the multi-cycle variants of EP, the sequence of such residual bits can be coded optimally as a separate component.

The total entropy-pump-encoded output size L(S) for sequence S[n] is the sum of the sizes of the three output components (e1), (e2), and (e3), which results in:

$$L(S)=L(T)+L(Z)+L(1)=H(S) \tag{14}$$

Hence the EP output size L(S) is equal to the entropy H(S).

EP1 Decoding

The decoder receives the encoded components (e1)-(e3). In some embodiments, to it will also receive p and n (in which case p may be a parameter either of the particular sequence or of the source generally), but, as we have above for comparison with H(S), we will assume that the decoder already "knows" those parameters.

Figure 4:
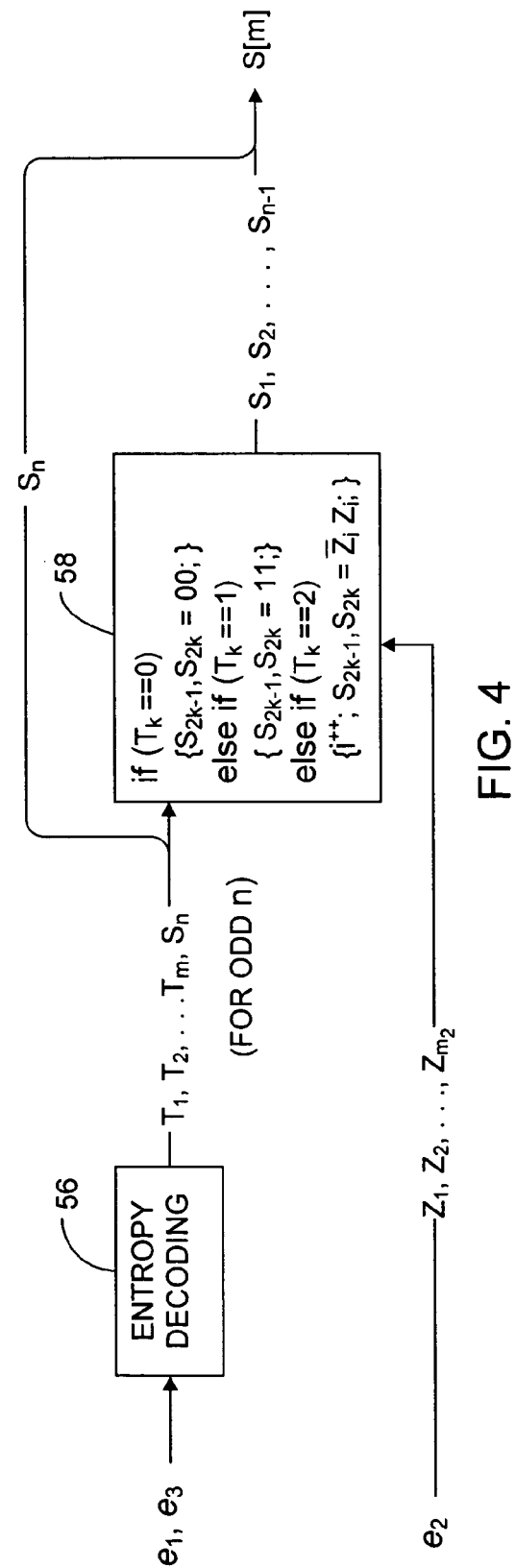
FIG. 4 is a block diagram that illustrates a complementary decoder.

As FIG. 4's block 56 indicates, an entropy decoder that matches the entropy encoder represented by FIG. 3's block 54 decodes component e1 to recover the sequence of is class tags $T=T_1 \ T_2 \ldots T_m$. If n is odd, that operation also produces the single residual bit $S_n$.

In an operation that block 58 represents, the decoder recovers block sequence $B=B_1 \ B_2 \ldots B_m$ by setting block $B_j$ to 00 for $T_j=0$ and to 11 for $T_j=1$. For $T_j=2$, a bit b is read directly from the received component (e2), and $B_j$ is set to: $\bar{b} \ b$, where $\bar{b}$ is the binary complement of b.

For odd n, the residual bit produced by the block-56 operation is appended to the block sequence B.

EP1 Performance

Although the single-cycle entropy pump of FIG. 3 still requires a full-scale entropy coder to produce output component e1, it also produces component e2, which represents 2mpq bits (cf. eqs. (10), (11)) of the full entropy H(S) without the computation-intensive operations normally required of entropy encoding. Specifically, e2 contains no contribution from blocks whose bits are both the same, and, for those whose bits differ, all the entropy pump needs to do is place each such block's second bit at the current end of the output array Z, which is not subjected to computation-intensive encoding.

Figure 5:
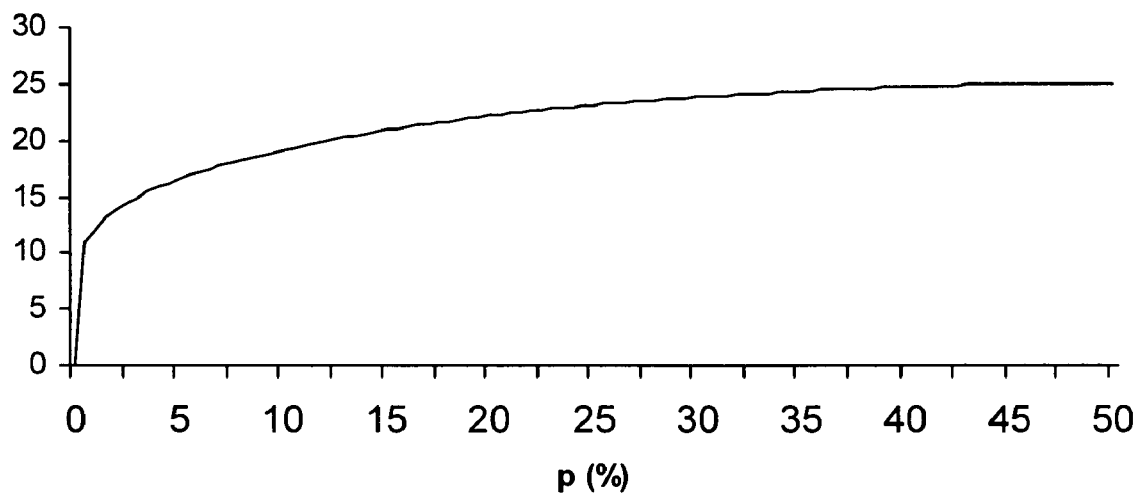
FIG. 5 is a graph illustrating how much entropy-encoding computation the entropy pump of FIG. 3 avoids.

Therefore, using the entropy pump avoids the following fraction of the coding/decoding work that would otherwise be required:

$$f(p)=2m \ pq \ |H[S]=pq/h(p)-O(1/n) \tag{15}$$

and replaces that fraction with operations of FIG. 3's block 52, which are much simpler and quicker. We call the fraction f(p)) the single-cycle pump efficiency at a given probability p. FIG. 5 depicts single-cycle-pump efficiency j(p) as a function of p. The maximum efficiency f is 25% (achieved for p=50%), and the minimum efficiency f=0 is reached in the limit p→0.

Note that in the vicinity of both extreme points (p=0.5 and 0) the coding can be simplified further. In the high-entropy limit, when p is "close enough" to 0.5 (meaning, say, $0.5-1/\sqrt{n} \leq p \leq 0.5$), the sequence S[n] is incompressible, so we can output it without encoding. In the low-entropy limit (p→0), where the pump efficiency drops to 0, the regular quantized-indexing coder becomes computationally much more efficient, making additional use of an entropy pump for performance gain unnecessary. Fast run-length coders also become practical in this limit (albeit at compression ratios lower than those of asymptotically optimal coders such as enumerative and arithmetic).

EP2: Two Cycles, Two Symbols/Block

As was stated above, the entropy encoding operation that FIG. 3's block 54 represents can be any type of entropy encoding. Indeed, since FIG. 3's operation as a whole is itself a type of entropy encoding, the block-54 operation could be a recursion of the FIG. 3 operation, as FIG. 6 illustrates in a second, "two-cycle" example, which we refer to as "EP2."

Now, FIG. 3's entropy operation 54 is depicted as operating on the class-tag sequence $T=T_1 \ T_2 \ldots T_m$, whose symbols are described as drawn from a ternary alphabet. One way of operating on symbols in such an alphabet is to perform a binary decomposition, a s my previous application describes in ¶¶0142 to 0166. FIG. 6 employs that approach, decomposing ternary-symbol sequence T into two binary-symbol sequences, X and Y, to each of which it applies FIG. 3's EP1 method so as to encode each optimally and thereby obtain the optimal encoding for T and thus for S[n].

EP2 Encoding

Figure 6:
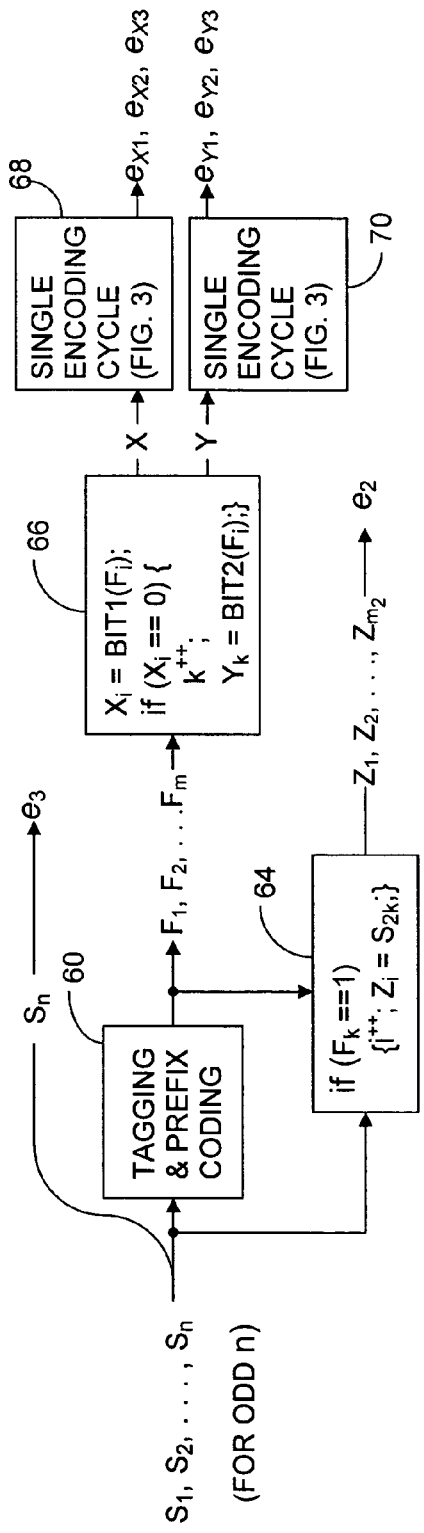
FIG. 6 is a block diagram of an encoder that employs two cycles of entropy pumping.

FIG. 6's block 60 represents the combination of a tagging operation of the type discussed above in connection with FIG. 3's block 50 and a prefix-coding operation, which will now be described, on which a binary decomposition of the tagging operation's resultant sequence T is based. The prefix-coding operation assigns prefix-code values $F_j$ to the tags $T_j$ (for j=1 ... m) in accordance with the following prefix code:

$$T_j=0 \Rightarrow F_j=00 \tag{16a}$$

$$T_j=1 \Rightarrow F_j=01 \tag{16b}$$

$$T_j=2 \Rightarrow F_j=1 \tag{16c}$$

(A prefix code is one in which no code value is a prefix of any other code value, so one can infer from the symbol sequence where one code value ends and another code begins even though different codes are made up of different numbers of symbols.) The result is a sequence of prefix-code values $F=F_1 \ F_2 \ldots F_m$.

FIG. 6's block 64 represents the same operation as FIG. 3's block 52: without entropy encoding the indices $Z[m_2]= Z_1 \ Z_2 \ldots Z_{m_2}$ of the input sequence's two-bit blocks that belong to the $T_j=2$ ($F_j=1$) class, emitting them as a high-entropy component $e_2$. Block 66 represents generating two sequences $X[m]=X_1 \ X_2 \ldots X_m$ and $Y[s]=Y_1 \ Y_2 \ldots Y_S$ that specify, in a way that we now describe, the sequence of classes to which the input sequence' blocks belong. Binary sequence $X[m] = X_1 X_2 \ldots X_m$ is constructed by setting bit $X_j$ to the first bit of the jth prefix code $F_j$ for $j = 1 \ldots m$. (Actually, the code in block 66 and other blocks is merely conceptual; in practice, the $X[m]$, $Y[s]$, and $Z[m_2]$ arrays would more typically be generated concurrently, without generating tags or prefix codes separately from those arrays.)

As block 68 indicates, the resultant sequence $X[m]$ is then processed in accordance with the FIG. 3 approach, which includes the entropy-encoding operation of FIG. 3's block 54. If that is an arithmetic-coding operation, the one-bit and zero-bit probabilities $p_x$ and $q_x$ it uses are computed from the probabilities p and q of ones and zeros in the overall input sequence $S[n]$:

$$p_x = 2pq \text{ and } q_x = p^2 + q^2 \quad (17)$$

Since by our convention $p \leq q$, eq. (17) implies:

$$p \leq p_x \leq q_x \leq q \quad (18)$$

$$p_x/q_x = 2pq/(p^2+q^2) \geq p/q; \quad (19)$$

i.e., sequence $X[m]$ has an entropy density higher than that of the input sequence $S[n]$. The results of FIG. 6's operation are three components $e_{X1}$, $e_{X2}$, and $e_{X3}$. For component $e_{X1}$, the encoded output length $L(X)$ produced by $EP1(X)$ will be the entropy $H(X) = m \, h(p_x)$.

Binary sequence $Y[s] = Y_1, Y_2, \ldots, Y_s$ is constructed by setting bit $Y_i$ to the second bit of F's ith two-bit (00 or 01) prefix code. From eqs. (7) and (9), the total number s of symbols (bits) in the sequence $Y[s]$ and its average $\bar{s}$ are:

$$s = m_0 + m_1 = m - m_2 = \overline{m_2} \quad (20)$$

$$\bar{s} = m \cdot q_x = m \cdot (p^2 + q^2); \quad (21)$$

i.e., the length s of Y is the same as the number of zeros in X. As block 70 indicates, this sequence is processed, as X is, in accordance with the FIG. 3 operation, and the result is three components $e_{Y1}$, $e_{Y2}$, and $e_{Y3}$. For that operation's entropy-encoding operation, the respective probabilities $p_y$ and $q_y$ of ones and zeros in $Y[s]$ are computed in terms of p and q from eq. (6):

$$p_y = p^2/(p^2+q^2) \text{ and } q_y = q^2/(p^2+q^2) \quad (22)$$

From $p \leq q$ and eq. (22) we deduce relations among the four probabilities:

$$p_y \leq p \leq q \leq q_y \quad (23)$$

$$p_y/q_y = (p/q)^2 \leq p/q \quad (24)$$

Figure 7:
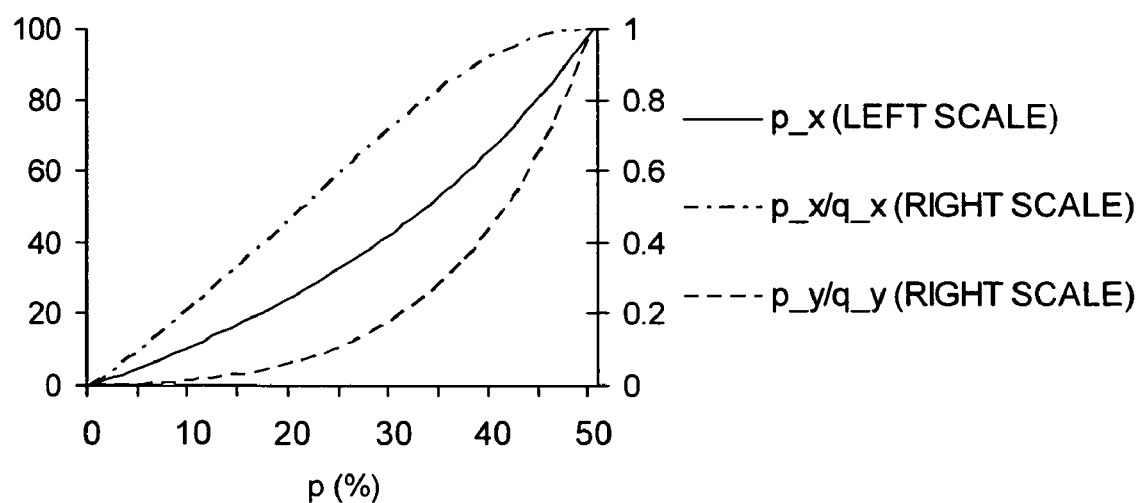
FIG. 7 is a graph of the computed probabilities that the encoder of FIG. 6 uses to encode different components.

I.e., sequence $Y[s]$'s entropy density is lower than that of the input sequence $S[n]$, and, in fact, it is related quadratically to it for small p. One can also appreciate from eq. (24) that, in the multiple-cycle version that will be described below in connection with FIG. 13, the entropy density of successive Y-branch recursions' $e_{Y2}$ components decays exponentially with the square of the number of recursions. FIG. 7 shows the average ratios of ones to zeros for the arrays $S[n]$, $X[m]$, and $Y[s]$ for different values of the probability p of ones in $S[n]$.

The encoding $EP1(Y)$ will have length $L(Y) = H(Y)$, so $e_{x1}$ and $en_{y1}$'s combined output size is:

$$L(X) + L(Y) = H(X) + H(Y) = H(T), \quad (25)$$

where the last identity in (25) follows from the binary decomposition's optimality, as can be appreciated by reference to my previous application's ¶¶0138-0144.

We mention in passing that some embodiments of the invention may send FIG. 6's eight components $e_2$, $e_3$, $e_{X1}$, $e_{X2}$, $e_{X3}$, $e_{Y1}$, $e_{Y2}$, and $e_{Y3}$ to the decoder separately, but it is preferable to combine the components in some way avoid the bit-fraction loss at component boundaries in which separate component processing can result. If an arithmetic coder is used for FIG. 3's entropy-encoding operation 44, for example, the components should be coded into a single arithmetic-coding stream, i.e., without flushing the encoder state between components, but preferably with appropriately different probabilities for the different components. If enumerative encoding is used, the bit-fraction losses can be avoided by, e.g., using mixed-radix codes, preferably in the manner that Appendix B describes.

EP2 Decoding

Figure 8:
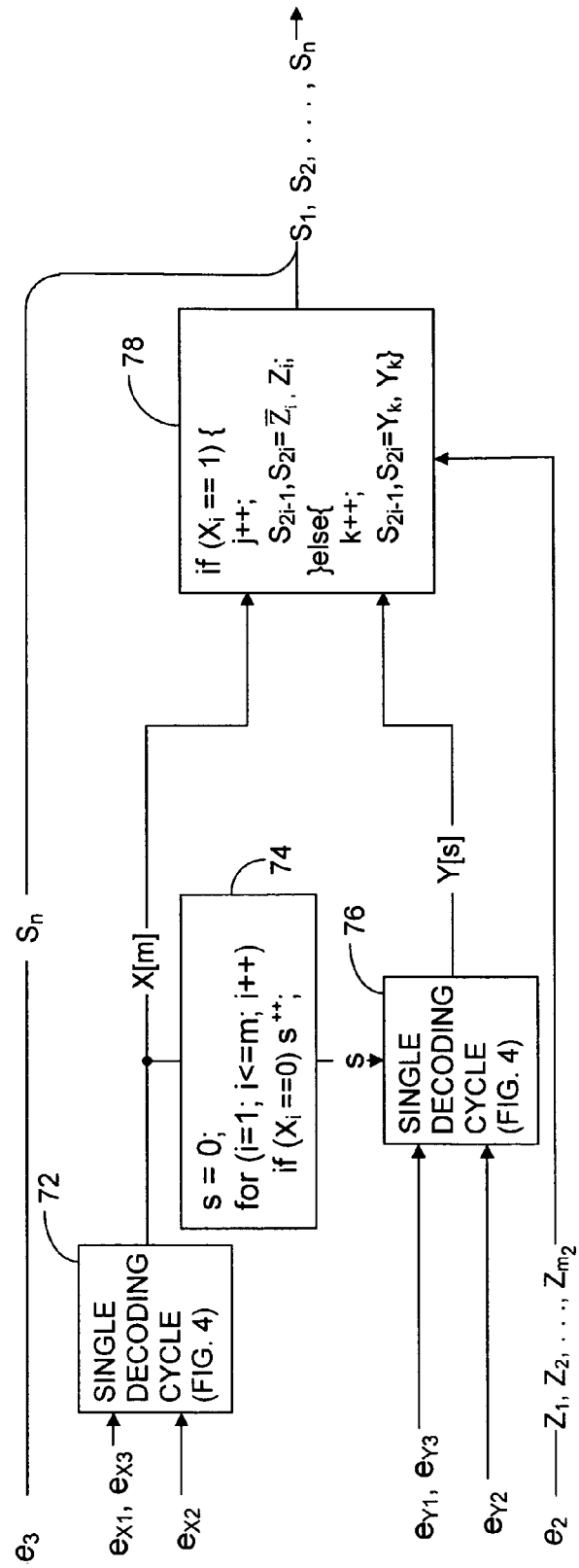
FIG. 8 is a block diagram of a decoder used for the FIG. 6 encoder's output.

As FIG. 8 indicates, the decoder receives eight components $e_2$, $e_3$, $e_{X1}$, $e_{X2}$, $e_{X3}$, $e_{Y1}$, $e_{Y2}$, and $e_{Y3}$. Components $e_{X1}$, $e_{X2}$, and $e_{X3}$ are decoded into $X[m]$ by the EP1 decoder of FIG. 4. FIG. 8's block 72 represents that operation, in which the entropy decoding of FIG. 4's block 56 is performed by using probabilities $p_x$ and $q_x$ computed in accordance with eq. (17) from known p and q. As FIG. 8's block 74 indicates, the decoded array $X[m]$ is then used to compute s (the expanded length of array $Y[s]$) by setting s equal the count of zeros in $X[m]$. With s thus determined, EP1 decoder of FIG. 4 then decodes components $e_{Y1}$, $e_{Y2}$, and $e_{Y3}$ into $Y[s]$, as block 76 indicates, the probabilities $p_y$ and $q_y$ used for that purpose having been computed in accordance with eq. (22).

As block 78 indicates, the EP2 decoder of FIG. 8 then computes the output sequence $S[n]$ from decoded sequences $X[m]$ and $Y[s]$ and component $e_2$. Specifically, it emits two bits of $S[n]$ for every bit of $X[m]$. If the $X_i$ is a one bit, then the two output bits are the class 2 two-bit block of which the $e2$ component's next bit is the index. Otherwise, the next block is 00 if the next $Y[s]$ bit is a zero, and it is 11 if the next $Y[s]$ bit is a one. For n odd, $S_n$ is component $e_3$.

EP2 Performance

Figure 9:
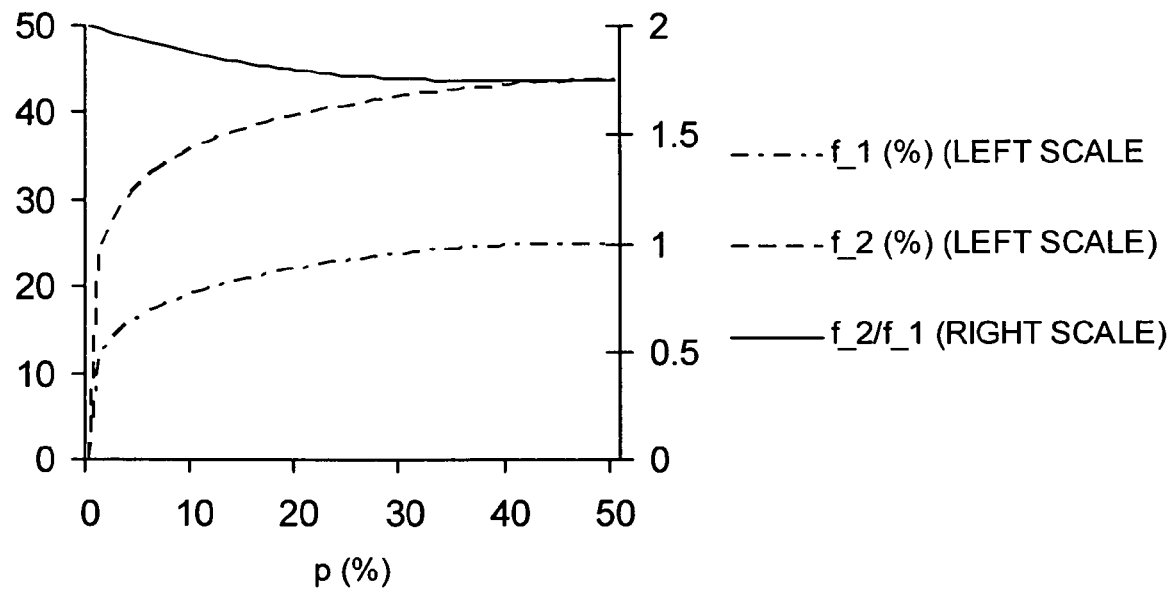
FIG. 9 is a graph that compares FIG. 6's the pumping efficiency with FIG. 3's.

The principal difference between EP1 and EP2 is that the EP2 algorithm yields faster performance in return for slightly greater complexity. Specifically, EP2 inexpensively pumps out from components $X[m]$ and $Y[s]$ some additional entropy that in EP1 remains in the ternary sequence $T[m]$ that gets processed in accordance with regular entropy. Using the pump-efficiency formula, eq. (15), to arrays $X[m]$, $Y[s]$, and $Z[m_2]$, we obtain the average pump efficiency $f_2(p)$ for EP2 as:

$$f_2(p) = (2mpq + 2\lfloor m/2 \rfloor p_x q_x + 2\lfloor s/2 \rfloor p_y q_y)/H(S) \quad (26)$$
$$= (1 + q_x + pq/2q_x)pq/h(p)$$
$$= (1 + q_x + pq/2q_x) \cdot f_1(p) \geq 1.75 f_1(p),$$

where $f_1(p)$ is the pump efficiency of EP1 from eq. (15). FIG. 9 shows $f_2(p)$, $f_1(p)$, and their ratios for different values of p. The ratios $f_2/f_1$ range between 1.75 and 2.

EP3: Multi-Cycle, Two Symbols/Block

Figure 10:
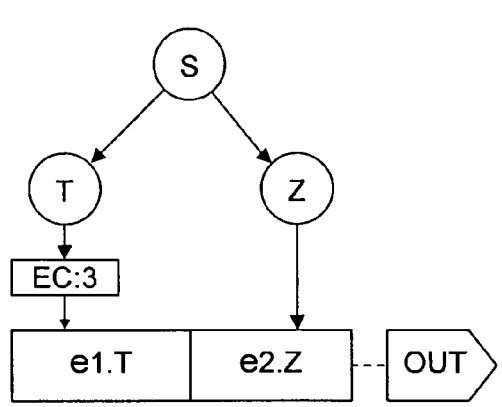
FIG. 10 is a simplified diagram of a single-pumping-cycle-type encoder in which the entropy encoder is depicted as having a ternary input.
Figure 11:
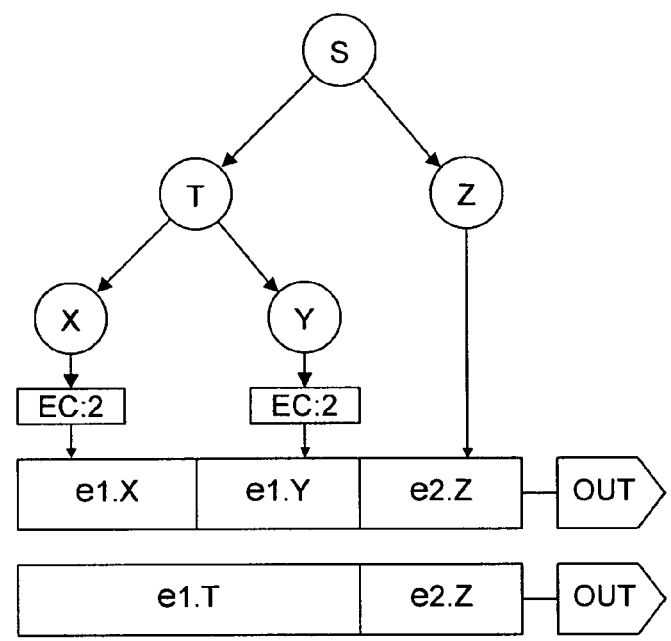
FIG. 11 is a simplified diagram of a single-pumping-cycle-type encoder in which the entropy encoding is depicted as being performed on binary inputs.
Figure 12:
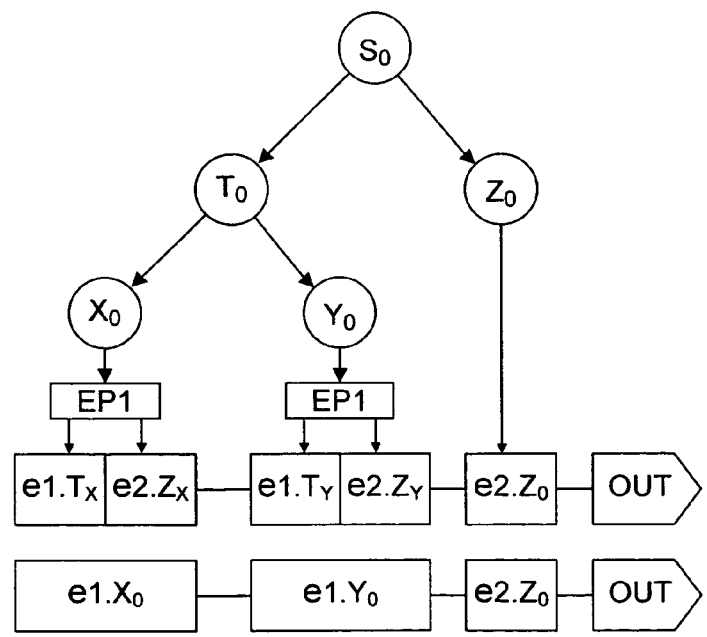
FIG. 12 is a simplified diagram of the two-pumping-cycle encoder of FIG. 6.

To describe extending the above-described EP2 embodiment's single recursion to arrive at a general multi-cycle embodiment ("EP3"), we will simplify the graphical representation. FIGS. 10 and 11 depict EP1's processing steps and data flows in this simpler manner, and FIG. 12 depicts EP2's. FIG. 10's "EC:3" block represents ternary-input entropy encoding, FIG. 12's "EC:2" blocks represent binary-input entropy encoding, and FIG. 12's "EP1" blocks represent operations of the type that FIG. 10 and depict.

For the sake of simplicity, FIGS. 10-12 omit the e3 component (the residual bit for odd n), with the understanding that in the case of odd n the entropy-encoding input would preferably be produced by concatenating the residual bit with one of the entropy-encoding inputs that those drawings show. In the case of an arithmetic version of entropy coding, for example, the arithmetic encoder would be used to encode both e1 and e3, and the EC state would not be flushed between e1 and e3 encodings.

FIGS. 10-12's rows containing the "out" blocks represent the encoding operations' output streams. FIGS. 11's and 12's lower "out"-containing rows depict those streams at a higher level.

FIG. 12's depiction of the two-cycle entropy pump ("EP2") uses component sub-scripts 0, x, and y to distinguish among the three EP input sequences $S_0$, $S_x$ and $S_y$ (as well among as their respective outputs), where $S_0 \equiv S$ (the original input sequence), $S_x \equiv X_0$, and $S_y \equiv Y_0$.

Figure 13:
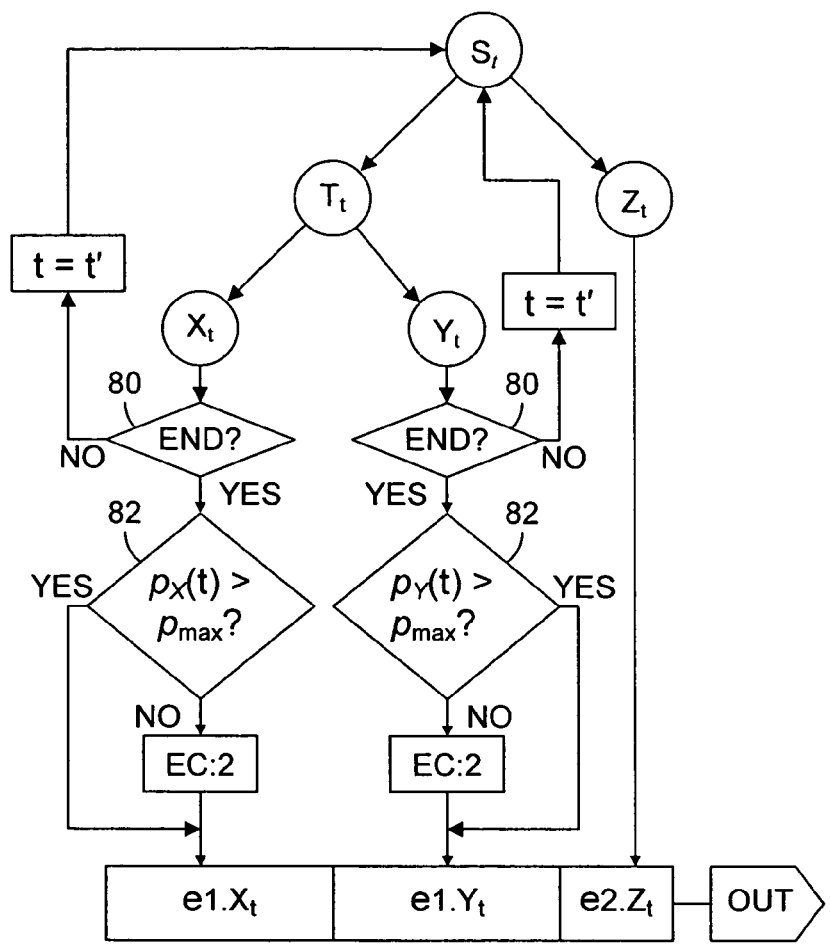
FIG. 13 is a simplified diagram of the multiple-pumping-cycle encoder.

FIG. 13 introduces the general recursive entropy-pump method ("EP3") for two-binary-symbol blocks, depicting it as an extension of the FIG. 11 method, i.e., as an extension of the single-cycle approach in which the class identifiers are decomposed into binary entropy-encoder inputs. The essential difference between EP3 and its predecessors EP1 and EP2 is that, as FIG. 13's blocks 80 indicate, EP3 introduces a termination test on the current data before passing the data to the EC:2 entropy coders. If that test's result is affirmative, recursion ends, the current data are either passed to EC:2 or, for reasons that will be explained below, placed into the output stream without further encoding. Otherwise, the task subscript t becomes one higher than the highest assigned so far, and the current data become the new input $S_t$.

The type of criterion on which the decision whether to end recursion is based is not critical. Some embodiments, for example, my simply end recursion when the current termination decision's depth of recursion d equals some maximum depth $d_{max}$. The special cases $d_{max}=0$ and $d_{max}=1$ are equivalent to the EP1:2 and EP2 methods.

Although this type of termination criterion is simple to implement, it is insensitive to the data being processed, and making $d_{max}$ too large may hinder performance because of the processing overhead required when the number of small components is large. So most embodiments will likely employ criteria that, although not too expensive to compute, in some way compare the processing costs of managing multiple components of decreasing sizes (as the recursion depth grows) with the computation-cost avoidance in which emitting the Z components results.

In the examples below, for example, we will assume the termination test at each of FIG. 13's EC:2 coding operations is such that that coding operation's input is diverted to become the S array for a further recursion unless one or more of the following three criteria are satisfied: (1) that the less-probable symbol's probability p' at that operation's depth exceeds some maximum $p_{max}$, (2) that the sequence size n' presented at that operation is less than or equal to a minimum $n_{min}$, and (3) that the less-probable symbol's probability p' at this depth is less than or equal to a minimum $p_{min}$. Parameters $n_{min}$, $p_{min}$, and $p_{max}$ may be adjusted to a given computing environment and redundancy requirements.

It bears repeating at this point that for the sake of concreteness and ease of exposition the probabilities have been assumed in the example embodiments to be known a priori as a characteristic of the source over a large number of sequences, i.e., that in most cases the actual symbol population of any given sequence will not match the assumed probabilities exactly. Also, we have taken the component probabilities used for the termination criteria and as entropy-encoder parameters to be computed as described above from the source's assumed input-sequence probabilities. It is not a requirement that these parameters be determined in this way, and some of the present invention's embodiments may instead use the actual sequences' counts as the probability parameters' bases. But thus adopting different probability bases adds overhead that the theoretical advantage of adopting more-accurate probability assumptions does not always justify, so in the further examples below we persist in the assumption that source parameters are known a priori.

Independently of the probability parameters' bases, the rationale behind the first, $p'>p_{max}$ criterion mentioned above is that it indicates that the data are approximately incompressible and that they should therefore be copied directly into the corresponding output component e1, without the entropy coding step EC:2. This "incompressibility" assumption is most valid if $p_{max}$ is made to depend on the sequence length. For example, $p_{max}$ could be set to satisfy the following inequality, which is derived from the fact that the standard deviation for the binomial distribution equals $(npq)^{1/2}$:

$$\frac{1}{2} - \frac{1}{\sqrt{n_d}} \leq p_{max} \leq \frac{1}{2} \qquad (27)$$

The second and third criteria above, i.e., $n' \leq n_{min}$ and $p' \leq p_{min}$, depend on the entropy coder EC:2's properties. Specifically, parameter $p_{min}$ depends on the availability of fast coding modes (such as run-length coding) for sparse data, and parameter $n_{min}$ depends on the efficiency desired and on how short the sequence can be without completely compromising the advantages of the particular type of encoder. As FIG. 13's block 82 indicates, entropy encoding of the relevant component occurs upon recursion termination in the illustrated embodiment only if the first of the termination criteria was not satisfied.

Figure 14:
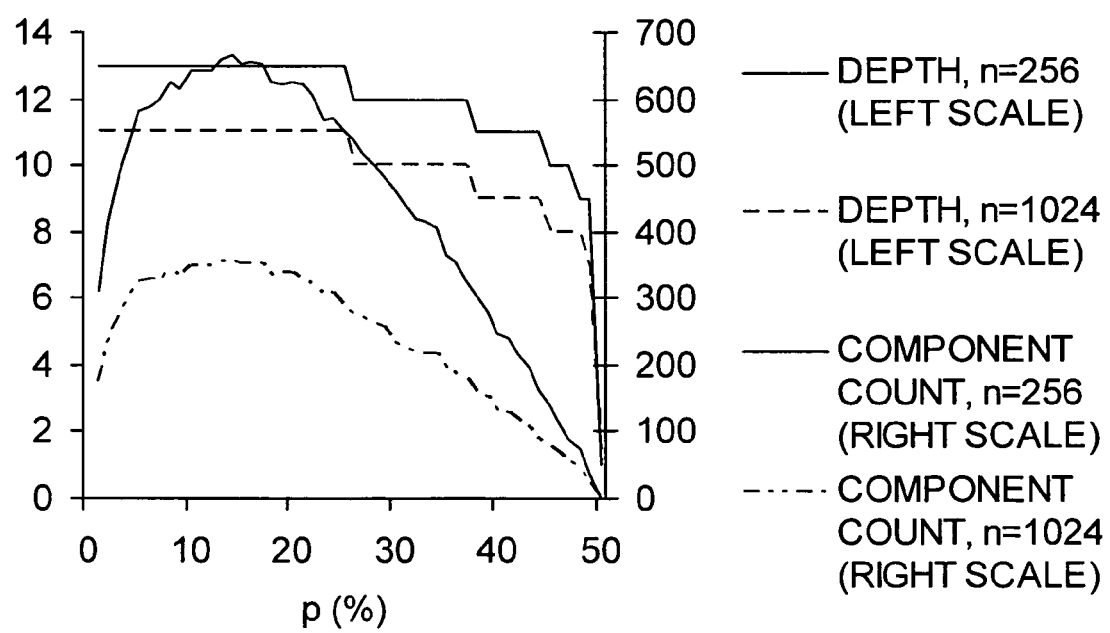
FIG. 14 is a graph that illustrates the effects that different termination criteria have on a multiple-pumping-cycle encoder's recursion depth and number of output components.
Figure 15:
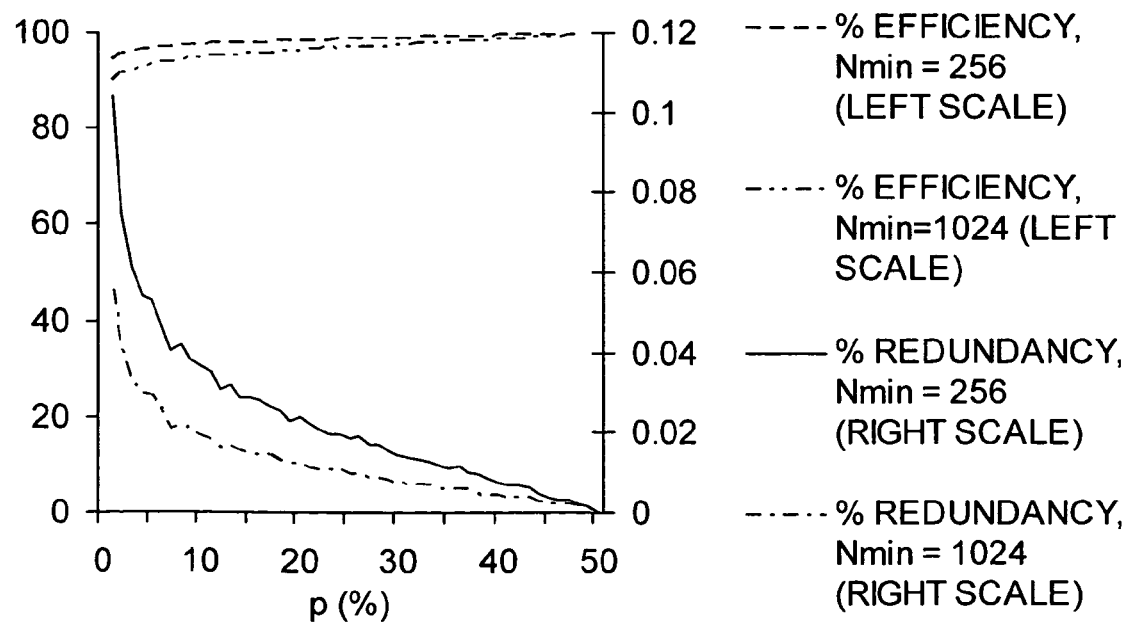
FIG. 15 is a graph that illustrates the effects that different termination criteria have on a multiple-pumping-cycle encoder's pumping efficiency and excess redundancy.

FIGS. 14 and 15 show how criterion-parameter selection can be expected to affect performance. For an input-sequence length n of $2^{20}$ bits, a minimum probability $p_{min}=1/n$, and a maximum probability $p_{max}=0.5-0.5n^{1/2}$, FIG. 14 shows that choosing 256 as the minimum component length $n_{min}$ can be expected to result in a greater maximum depth and many more output components than choosing 1024 can. FIG. 15 shows the greater pumping efficiency that the greater depth affords. It also shows that thus avoiding more entropy-encoding operations results in some (albeit quite small) redundancy penalty.

This redundancy results from two fractional-bit losses. The first is the bit-fraction loss for the termination under the "incompressibility" condition (c1), where we copy the whole number of input bits into the output component. The second is the bit-fraction loss from the components of type Z, which were stored into the next whole number of bits when the data size $n_d$ is an odd number, and we therefore have a non-integer number of blocks $B_j$. The latter simplification is not necessary, and the resulting small loss can be eliminated at some computational cost by using optimal encoding of the residual bit (cf. eq. (12) for component e3 coding). These fractional bit losses will cause an average excess of 0.5 bits per component.

Decoding the output of the multiple-pumping-cycle encoder is simply an extension of the FIG. 8 approach. But it may be helpful to discuss the considerations that go into selecting the order in which the many output components are to be processed. The basic consideration can be appreciated by considering FIG. 8's blocks 72 and 74. They show that the components resulting from FIG. 6's operation 68, i.e., from applying the single-cycle (FIG. 3) encoding operation to FIG. 6's X component, need to be processed first so that the parameters required are available for FIG. 8's operation 76, i.e., for determining the Y component. We use that consideration to arrive at the processing order.

To that end we present a more general formulation of the recursion step and the output component layout. We will consider the components $S_t$, $T_t$, $X_t$, $Y_t$, and $Z_t$ that the FIG. 13 cycle operate on as forming a five-node tree $G_t$:

$$G_t = \{S_t, T_t, X_t, Y_t, Z_t\}, \quad (28)$$

whose topology FIG. 13 suggests.

Four of these five components, i.e., all except $T_t$, contain binary arrays. Each of these four nodes is characterized by a respective binary array length $n_g(t)$, probabilities $p_g(t)$ of ones, and its probabilities $q_g(t)=1-p_g(t)$ of zeros, where the node subscript g=s, x, y, or z. The relationships among these four sets of array parameters $\{n_g(t), p_g(t), q_g(t)\}$ for g=s, x, y or z are given in connection with EP2.

If we omit the label t, which is common to all parameters, these relationships in a generalized notation for EP3 become:

$S_t[n_s] \to X_t[n_x]$ via (e1.X)

$$n_x = \lfloor n_s/2 \rfloor \quad (29a)$$

$$p_x = 2\, p_s q_s \quad (29b)$$

$$q_x = 1 - p_x = p_s^2 + q_s^2 \quad (29c)$$

$S_t[n_s] \to Y_t[n_y]$ via (e1.Y)

$$n_y = \text{\# of zeros in } X_t[n_x] \quad (30a)$$

$$p_y = p_s^2/(p_s^2 + q_s^2) \quad (30b)$$

$$q_y = q_s^2/(p_s^2 + q_s^2) \quad (30c)$$

$S_t[n_s] \to Z_t[n_z]$ via (e2)

$$n_z = \text{\# of ones in } X_t[n_x] \quad (31a)$$

$$p_z = \tfrac{1}{2} \quad (31b)$$

$$q_z = \tfrac{1}{2} \quad (31c)$$

Eqs. (29)-(31) show that, if we define a node's content as its array and its parameters n, p and q, then the content of the $G_t$ nodes $X_t$, $Y_t$ and $Z_t$ is built up uniquely from the content of $G_t$'s root node $S_t$. Further, while the $X_t$ parameters are computed by using only the $S_t$ parameters, $Y_t$'s and $Z_t$'s parameters also require $X_t[n_x]$'s symbol counts.

As FIG. 13 shows, EP3's recursion mechanism involves two "no" paths back to the root, node $S_{t'}$ of a new node $G_{t'}$ from the termination ("end?") decisions, i.e., from the decisions whether to perform further cycles on $X_t[n_x]$ and $Y_t[n_y]$). (For the sake of convenience, we will assign each tree an index such that the value of the new tree's index t' is one greater than the highest tree index assigned so far.)

The initial tree $G_0$ is defined as follows in terms of the main input S[n] of EP3 and its parameters n, p, and q:

Initial Tree $G_0$ $$n_s(0)=n,\ p_s(0)=p,\ q_s(0)=q \quad (32a)$$

$$S_0[n_s(0)]=S[n] \quad (32b)$$

Eqs. (29)-(31) give the remaining parameters $n_g(0)$, $p_g(0)$, $q_g(0)$ for g=x, y and z.

Eqs. (33)-(34) show that the new tree $G_{t'}$ is obtained from $G_t$ by replicating the content of $X_t$ or $Y_t$ as the content of $S_{t'}$ and using eqs. (29)-(31) to rebuild the rest of $G_{t'}$ from $S_{t'}$.

Generation $G_t \to G_{t'}$ via $X_t$ "no"-path $$n_s(t')=n_x(t) \quad (33a)$$

$$p_s(t')=p_x(t) \quad (33b)$$

$$q_s(t')=q_x(t) \quad (33c)$$

$$S_{t'}[n_s(t')]=X_t[n_x(t)] \quad (33d)$$

$$S_{t'} \to X_{t'}, Y_{t'}, Z_{t'} \text{ via (29)-(31)} \quad (33e)$$

Generation $G_t \to G_{t'}$ via Yt "no"-path $$n_s(t')=n_y(t) \quad (34a)$$

$$p_s(t')=p_y(t) \quad (34b)$$

$$q_s(t')=q_y(t) \quad (34c)$$

$$S_{t'}[n_s(t')]=Y_t[n_y(t)] \quad (34d)$$

$$S_{t'} \to X_{t'}, Y_{t'}, Z_{t'} \text{ via (29)-(31)} \quad (33e)$$

Since each $G_t$ can give rise to at most two trees, $G_{tx}$ (via (33)) and $G_{ty}$ (via (34)), we can represent the full recursion of EP3 as a binary tree $\Gamma=\Gamma(S[n], n,p,n_{min},p_{min}, p_{max})$, with $G_t$ (for t=0, 1, ... $t_{max}$) as its nodes.

Of course, the tree nomenclature used here is conceptual, and there is no reason in principle why an encoder or decoder that employs the present invention's teachings needs to organize its data in such a way that, say, any particular memory segment can readily be considered to store all of a node's data or pointers to them. As a practical matter, though, it will usually be convenient for software implementations to be written in terms of node data structures. To describe a beneficial order in which to send the output components, moreover, it is helpful to assume structure of this type so arranged that their parent-child relationships implicitly implement the following rules for the mapping $\{G_t: \text{for } t=0,1, \ldots t_{max}\} \to \Gamma$:

Γ-Tree Construction (35)

a) Set $G_o$ as the root of Γ.
b) Each Γ node $G_t$ in which both termination decisions are negative gets both a left child $G_t^x$ and a right child $G_t^y$.
c) Any Γ node $G_t$ in which both termination decisions are positive is a leaf of Γ.
d) Each Γ node $G_t$ in which only the $Y_t$ termination decision is negative gets a left child $G_t^x$, and the $Y_t$ node of the tree $G_t$ becomes Γ node $G_t$'s right child in the Γ tree. This $Y_t$ is a leaf of Γ.
e) Each Γ node $G_t$ in which only the $X_t$ termination decision is negative gets a right child $G_t^y$, and the $X_t$ node of the tree $G_t$ becomes Γ node $G_t$'s left child in the Γ tree. This $X_t$ is a leaf of Γ.

As will be seen below, rules (d) and (e), which are imposed to cause every node either to be a leaf node or have two children—i.e., which are imposed to avoid single-child nodes—make it easy to state the rules for the order in which the illustrated embodiment places components in the output.

Figure 16:
FIG. 16 is a diagram that represents the quantities involved in a two-binary-symbol-block-length single-entropy-pump-cycle encoder as a single tree node.
Figure 17:
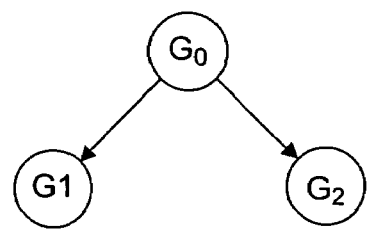
FIG. 17 is a similar diagram for such a two-entropy-pump cycle encoder.
Figure 18:
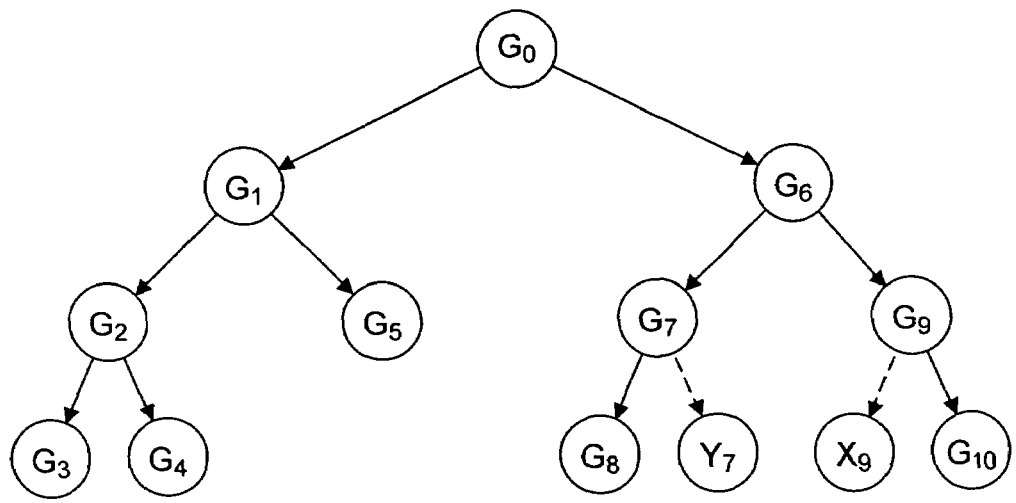
FIG. 18 is a similar diagram for one example execution scenario in such a multiple-pump-cycle encoder.

FIGS. 16 and 17 depict Γ trees for EP1 and EP2, and FIG. 18 depicts a thirteen-node, maximum-depth-three Γ tree as an example for EP3. Each of the G-type nodes in the Γ tree corresponds to a respective each $G_t$ tree for which coder processing computes nodes $X_t$, $Y_t$, $Z_t$ and the "residual bit" $r_t$ from the root node $S_t$ in a manner identical to that employed by the EP2 processing described above by reference to FIG. 6. The labels t are assigned to FIG. 18's nodes in the depth-first order of node creation that results most naturally from the decision-making operations that FIG. 13 depict. Because of decoder logistics, the presence of multiple $G_t$ trees makes it desirable to adopt a systematic approach, which we now describe, for establishing the order in which those nodes' output components is actually sent.

Although FIG. 18 numbers the nodes in the order in which they are created, adopting an order convenient for sending their respective outputs involves taking into account the above-mentioned constraint that the decoder cannot reconstruct arrays $Y_t[n_y]$ and $Z_t[n_z]$ (which are needed to produce array $S_t[n_s]$ and move up the Γ tree) until it has reconstructed array $X_t[n_x]$; as eqs. (30a) and (31a) indicate, $n_y$ and $n_z$ are computed as the counts of zeros and ones in $X_t[n_x]$. Therefore, the decoder cannot know the parameters $n_y$ and $n_z$ of a tree $G_t$'s nodes $Y_t$ and $Z_t$ until it has decoded that tree's node $X_t$ and produced $X_t[n_x]$. Since the termination-test criteria (c1)-(c3) applied to $Y_t$ use $n_y$ as a parameter, the decoder cannot initially know the Γ tree's complete layout. The Γ tree layout is computed via eqs. (29)-(34), the mapping $\{G_t\} \rightarrow \Gamma$, and the termination criteria (c1)-(c3), from the known S[n] parameters n, p, and q and the agreed-upon termination criteria parameters $p_{max}$, $p_{min}$, and $n_{min}$. The only branch the decoder can know completely before decoding any components is the leftmost sequence of $G_t^x$ nodes, since its $n_x$ values are computed by successive halving of n (cf. eq. 29a). The decoder can also compute (before component decoding) all of the $p_g(t)$ values, for g=s,x,y, and z, via eqs. (29b,c)-(31b,c). So the encoder has to produce outputs in a sequence that enables it to reconstruct the Γ-tree structure incrementally.

To obtain such a sequence, we now examine the $G_t$ nodes' output components in more detail. The $G_t$ nodes produce up to four output components: the e1.$X_t$, e1.$Y_t$, and e2.$Z_t$ components that FIG. 13 depicts, and the e3.$Z_t$ component omitted as indicated above for the sake of simplicity. All $G_t$ nodes produce an $e^2.Z_t$ component, and those with odd $n_s(t)$ produce an e3.$r_t$ component. $G_t$ nodes in which the termination decision is affirmative for $X_t$ and/or $Y_t$ produce components e1.$X_t$ and/or e1.$Y_t$. The nodes where such affirmative decisions occur are the $G_t$ nodes that have fewer than two child nodes. Examples of such nodes in FIG. 18 are leaves $G_3$, $G_4$, $G_5$, $G_8$, $G_{10}$ and the single-child (non-leaf) nodes $G_7$ and $G_9$. Nodes $Y_7$ and $X_9$ which represent components of $G_t$ trees that would otherwise correspond to single-child nodes of Γ, exemplify application of the above-mentioned convention, stated in Γ rules (35d) and (35e), of adopting such components as nodes of Γ.

If we also adopt the convention that a given parent's child node derived from its parent's X component is always located to the left of a child node derived from that parent's Y component, the EP3 decoder will need to decode e1.$X_t$ of the leftmost Γ leaf (which is a $G_t$ leaf or $X_t$ leaf), since that is the only leaf node for which the decoder will have all parameters $p_x(t)$, $q_x(t)$, and $n_x(t)$ (computed via eqs. (29), (32), (33) and the above-mentioned termination criteria from the a priori parameters n, p, and q). From the $X_t[n_x]$ array thereby obtained, it can compute $n_y(t)$ and $n_z(t)$, which enable it to decode $Y_t$ and $Z_t$. From the decoded $X_t[n_x]$, $Y_t[n_y]$, and $Z_t[n_z]$ it can compute $S_t[n_s]$, which then allows it to recreate component $X_{t''}[n_x]$ or $Y_{t''}[n_y]$ of $G_t$'s parent node $G_{t''}$ by reversing the copying directions of eq. (33d) or (34d)).

Figure 19:
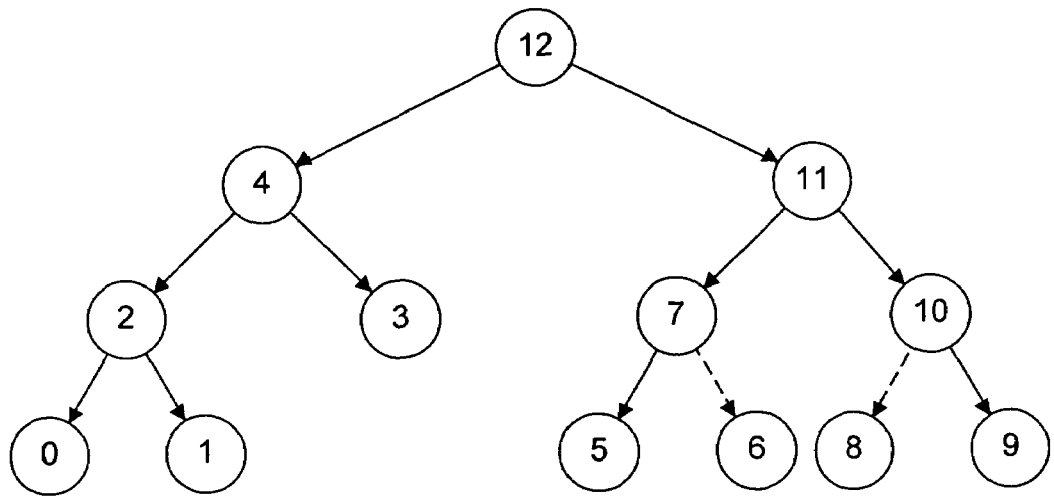
FIG. 19 is a similar diagram showing the order in the quantities in the FIG. 18 scenario would be recovered in an example decoder.

We will refer to this type of the tree traversal (visit the left subtree, then the right subtree, then the root) as postorder traversal. FIG. 19 shows this postorder visit sequence for the FIG. 18 example. It is most convenient for the encoder to provide its output in that order.

This implies that it will be convenient for decoding purposes if the EP3 encoder does not in general automatically send or generate for the output stream the four-component output of some Γ, of Γ (where $Γ_t$ is of G, X or Y type) when it first computes that component. Instead, it postpones the output until Γ, is visited for the last time. If node $Γ_t$ is a leaf, the first and the last visit is the same visit, so the output is produced immediately. Otherwise, the last visit to $Γ_t$ will be its third visit (by virtue of Γ rules (35d) and (35e), which imply that all internal $Γ_t$ nodes have exactly two child nodes). In FIG. 18, for example, this means that, although node $G_7$'s e2.$Z_7$ component may already have been computed before either node $G_8$'s components or the e1.$Y_7$ has been computed, e2.$Z_7$ appears in the output only after those components. FIG. 20 depicts code of the type that could be used to establish the postorder sequence.

Decoding for EP3 can be thought of as broken down into six steps:

1) The decoder constructs a partial node $G_0$ from the known n, p and q (via eqs. (32) and (29)), with only the parameters (not the data arrays) of $S_0$ and $X_0$ completed. ($Y_0$ and $Z_0$ cannot yet be determined, because computation of their lengths $n_y$ and $n_z$ requires $X_0[n_x]$'s symbol counts.)

2) Termination parameters $p_{min}, p_{max}$ are computed from the $X_0$ parameter $n_x$, and the termination test is invoked for $X_0$. Since $n_y$ is not yet available, the termination test cannot be performed for $Y_0$; indeed, that test's parameters $p_{min}$ and $p_{max}$ cannot yet be determined. So it is not yet apparent whether $G_0$ has a right subtree.

3) If the $X_0$'s termination decision is negative, the decoder can conclude that the encoder made a similar decision and, consequently, that the encoder output received by the decoder does not itself include an e1.$X_0$ component but instead includes components from lower-level encoder nodes, whose reverse operations need to be performed to arrive at e1.$X_0$. It therefore creates new (partial) nodes $G_t$ (t=1,2, . . . ) (with only the $S_t$, $X_t$, $p_{min}$, and $p_{max}$ parameters fully computed) and applies the termination test for each $X_t$ until that test produces an affirmative result. For each t it also computes $p_y(t)$ and $q_y(t)$ via eqs. (30b), (30c) and $n_s(t)$, $p_x(t)$, and $q_s(t)$ via eqs. (33).

In the FIG. 18 example, this step will traverse nodes $G_0$, $G_1$, and $G_2$.

4) When the termination test eventually produces an affirmative result for some $X_t$, the decoder has reached the leftmost leaf (e.g., $G_3$ in FIG. 18) of the current subtree (rooted at $G_0$). An EC:2 decoder is used to decode component e1.$X_t$, into array $X_t[n_x(t)]$. Parameter $n_y(t)$ is then obtained from $X_t[n_x(t)]$'s zeros count, and $n_z(t)$ is obtained from its ones count. From $n_y(t)$ and the already-computed $p_y(t)$ and $q_y(t)$ it computes termination-test parameters $p_{min}$, and $p_{max}$ for $Y_t$ and performs the termination test for that component.

In FIG. 18, the termination tests are affirmative for $X_3$ and $Y_3$.

5) If an affirmative outcome results from the termination test for $Y_t$ in step (4), the encoded components $e1.Y_t$, $e2.Z_t$ and $e3.r_t$ are available as the next encoded items, and they are decodable. (At this point the decoder knows: $p_y(t)$, $q_y(t)$, $n_y(t)$ for $Y_t[n_y]$, $n_z(t)$ for $Z_t[n_z]$ extraction, and $p_s(t)$, $q_s(t)$, $n_s(t)$ for $r_t$ decoding if $n_s(t)$ is odd.) From the decoded $X_t[n_x]$, $Y_t[n_y]$, $Z_t[n_z]$, and $r_t$ components, the decoder can reconstruct array $S_t[n_s(t)]$, which via eq. (33d) is a copy of $X_{t''}n_x(t'')]$ of the $G_t$'s parent node $G_{t''}$. Hence we have achieved the state of step (4), but for the $G_{t''}$ with $t''<t$, and thus we can proceed with step (4) and (5), recovering further arrays $X_t[n_t]$, each closer to the root $G_0$ of this subtree than the previous one.

In FIG. 18, $t''=2$, hence we have $X_2[n_x]$ as a copy of $S_3[n_s]$.

6) If the outcome of step (4)'s termination test for $Y_t$ is negative, node $G_t$ has a right child $G_{t'}$. In accordance with eq. (34), the decoder constructs a partial $G_{t'}$, with only the $S_{t'}$ and $X_{t'}$ parameters completed, but with array $X_{t'}\{n_x\}$, and therefore $n_y$ and $n_z$, not yet determined. This is as in step (1), so the decoder loops back through steps (1), (2), . . . as before, but starting from $G_{t'}$ rather than $G_0$: it processes the right subtree rooted at $G_{t'}$.

In FIG. 18, $G_t=G_2$ and $G_{t'}=G_4$. Since $G_4$ is a leaf, it is decoded immediately, which then provides decoded $Y_2[n_y]$ (via eqs. (34) in reverse). With $X_t[n_x]$ and $Y_t[n_y]$ available, the decoder computes $S_2[n_s]$, which via eqs. (33) is the same array as $X_1[n_x]$, and decoding continues in this fashion until $S_0$ had been obtained; i.e., the decoder decodes in the order that FIG. 19 shows.

From the facts that steps (1)-(6) proceed along each path and probe each decision branch of FIG. 13's EP3 flow diagram and that each traversal reduces the number of remaining undecoded components, the conclusion follows that no undecoded components are left when this procedure terminates.

Steps (1)-(6) focus on the logistics of decoding recursions along the different flow paths in FIG. 18. Merely showing the EP3 output's decodability is simpler. We will use mathematical induction and note first that the EP 1 and EP2 $\Gamma$ trees of depth $\lambda=0$ and 1 (see FIGS. 16 and 17) are decodable. Now, we assume that all $\Gamma$ trees up to some depth $\lambda$ are decodable, and we take two trees $\Gamma_1$ and $\Gamma_2$ so that one's depth is $\lambda$ and the other's does not exceed $\lambda$. We join $\Gamma_1$ and $\Gamma_2$ as the left and right subtrees of some new root node $G_0$, thereby forming a new tree $\Gamma_3$ of depth $\lambda+1$. Since $\Gamma_1$ and $\Gamma_2$ are decodable, and since the EP3 postorder output layout will result in the output components ordered into three contiguous sections as $\Gamma_1$, $\Gamma_2$, $G_0$, the EP3 decoder can decode $\Gamma_1$ and $\Gamma_2$ components (since each has depth $\leq\lambda$ and each is contiguous). So the decoder will produce the decoded content of root nodes $G_0$, and $G_{02}$ of subtrees $\Gamma_1$ and $\Gamma_2$, including their S components $S_{01}[n_s]$ and $S_{02}[n_s]$. Since $S_{01}[n_s]=X_0[n_y]$ and $SO_2[n_s]=Y_0[n_y]$, and since $Z_0[n_z]$ and $r_0$ are the next remaining undecoded components, we can decode them and construct $S_0[n_s]$, which is the input $S[n]$ for the tree $F_3$. Since all trees of depth $\lambda+1$ can be formed this way (as $\Gamma_3$), we can decode all trees of depth $\lambda+1$. Since we can decode trees of depth $\lambda\leq 1$, we can decode all trees of depth 2, 3, 4.

EP4: Entropy Pump with Block Lengths d>2 Symbols

For the sake of simplicity, the above examples assumed two-symbol blocks, but the principles that they illustrate are applicable to blocks whose number of symbols is greater than two. One way of applying such principles, for example, results in encoders and decoders that exhibit the following properties.

First, the (typically virtual) dictionary D (cf. eqs. (2)-(4)) contains all d-symbol sequences:

$$D=\{00\ldots 0,00\ldots 1,00\ldots 10,\ldots,11\ldots 1\} \quad (40)$$

$$|D|=\text{\# of entries in } D=2^d \quad (41)$$

Second, D is partitioned into $\alpha=d+1$ enumerative classes $D_c$:

$$D=D_0+D_1+\ldots+D_c, \quad (42)$$

where $c=0,1,\ldots d$ and $D_c$ is defined as a subset of D containing sequences with c ones:

$$D_0=\{00\ldots 00\} \quad (43a)$$

$$D_1=\{00\ldots 01, 00\ldots 10, \ldots, 10\ldots 00\} \quad (43b)$$

$$D_d=\{11\ldots 11\} \quad (43c)$$

The number of elements $|D_c|$ in the class $D_c$ is the binomial coefficient C(d,c):

$$|D_c| = \binom{d}{c} \equiv \frac{d!}{c!(d-c)!} \equiv C(d, c) \quad (44)$$

Third, the input S[n] is segmented into $m=\lfloor n/d \rfloor$ d-symbol blocks as: $B=B_1B_2\ldots B_m$, and the corresponding class-tag sequence $T[m]=T=T_1 T_2 \ldots T_m$ is (again, possibly only implicitly) generated, where each $T_j$ is a symbol 0, 1, . . . d identifying the enumerative class Ec (c=0, 1, . . . , d) to which the block $B_j$ belongs. (For sequence lengths n for which $r\equiv(n \bmod d)>0$, the last r bits of S[n] are sent separately from the blocks $B_j$ in, e.g., a manner similar to that in which EP1's residual bit is sent.) T is therefore a sequence in an alphabet of size $\alpha=d+1$ defined by:

$$B_j \in E_c \Rightarrow T_j=c \text{ where: } c=0\ldots d \text{ and } j=1,2,\ldots m \quad (45)$$

The probabilities $p_c$ of occurrence of tags $T_j$ in T with values $c=0, 1, \ldots, d$ are:

$$p_c \equiv P(T_j = c) = p^c q^{d-c} \binom{d}{c} \quad (46a)$$

$$q_c \equiv 1 - p_c \quad (46b)$$

We denote counts in T of tags $T_j$ with value c as $m_c$ and define:

$$\overline{m}_c = m - m_c \quad (47)$$

The counts $m_c$ satisfy constraints:

$$m_0+m_1+\ldots+m_d=m=\lfloor n/d \rfloor \quad (48a)$$

$$0 \leq m_c \leq m \text{ for } c=0\ldots d \quad (48b)$$

The probability that a given $m_c$ has value p is the binomial distribution:

$$P(m_c = \mu) = p_c^\mu q_c^{m-\mu} \binom{m}{\mu} \quad (49)$$

Fourth, for each block $B_i$ that belongs to a class $E_c$ of more than one member—i.e., for each block that does not belong to (single-member) class $E_0$ or $E_d$—we compute its enumerative index $Z_i$ within its class $E_c$. (Exact enumeration is preferable for the indexing when the block size d is small, whereas quantized indexing is preferable for larger d such as, say, d>64). So the index $Z_i$ is an integer in the interval 0, $|E_c|$), and all values of $Z_i$ in this interval are equiprobable. We denote resulting sequence of $Z_i$ as:

$$Z[n_z] = Z_1 Z_2 \ldots Z_{n_z} \text{ where } n_z = m - m_0 - m_d \qquad (50)$$

Fifth, the encoder output for the single-cycle version EP4.1 has three components e1, e2, and e3, as EP1 does.

As in EP1, e1 is the (preferably, optimally) encoded sequence of class tags $T = T_1 T_2 \ldots T_m$. $T[m] \equiv T$ is a sequence of m symbols in an alphabet of size $\alpha = d+1$, with known symbol probabilities (eq. (46a)) and known symbol count $m = \lfloor n/d \rfloor$. The output size L(T) of the optimally encoded sequence T with known length m and symbol probabilities is the Shannon entropy for T:

$$L(T) = -m \sum_{c=0}^{d} p_c \log(p_c) = -m \sum_{c=0}^{d} p^c q^{d-c} \binom{d}{c} \log\left(p^c q^{d-c} \binom{d}{c}\right) \qquad (51)$$

Component e2 is again the enumerative-index sequence $Z[n_z]$. Since Z is a maximum-entropy sequence, it is incompressible if the source-alphabet size is an integer power of the output-channel alphabet size. In our case the output channel uses the binary alphabet: $\alpha = 2$. The source-alphabet size $R_i = R_i(c)$ for index $Z_i$ whose block $B_i \in E_c$ is:

$$R_i(c) = \binom{d}{c} \qquad (51)$$

Hence, for $R_i(c)$ which are integer powers of 2 we can output $Z_i$ without further encoding (as was the case for e2.Z component). Otherwise we can use mixed-radix codes (described in Appendix B). Since quantized-index coding in a fixed radix can use pre-computed tables of quantized radix powers (see the HRC method of Appendix B), while mixed-radix coding for a random sequence of radices $R_i$ requires computation of quantized radix products specific to each coding task, it is more practical to encode distinct radices $R_i(c)$ for $c = 1, 2, \ldots, \lfloor d/2 \rfloor$ (because of the symmetry $C(d,c) = C(d,d-c)$, radices $R_i(c) = C(d,c)$ for $c = 1 \ldots d-1$ have at most $\lfloor d/2 \rfloor$ distinct values).into separate fixed-radix output streams (whose sizes are determined from the quantized-radix-powers tables, since the tag sequence T provides a digit count for each fixed radix). Further reduction in sizes and number of distinct fixed radices needed is obtained by factoring powers of 2 from $R_i$ and by grouping remaining factors into a smaller number of smaller radices (which helps the QI-table-based fixed-radix computations).

The output length for index $Z_i$ belonging to radix $R_i(c)$ is $\log(R_i(c))$, and its probability is $p_c$. Hence the average length of output Z is:

$$L(Z) = m \sum_{c=0}^{d} p_c \log\binom{d}{c} \qquad (52)$$

The e3 (residual-bits) component has $r \equiv n \bmod d$ bits, and the cost to transmit it is:

$$L(r) = r \cdot h(p) = H(r) \qquad (53)$$

The total length L(S) of the EP4 output for input S[n] is (via eqs. (51)-(53)) optimal:

$$L(S) = L(T) + L(Z) + L(r) = H(B) + H(r) = H(S) \qquad (54)$$

EP4 Decoding

EP4 decoding works similarly to EP1, the only differences being that the entropy coder in step (e1) codes in a d+1-symbol alphabet instead EP1's three-symbol alphabet and that the sequence Z is decoded via a mixed-radix decoder into values $0 \leq Z_i < R_i(c)$, so $Z_i$ identifies d-bit patterns from the $E_c$ classes instead of EP1's two-bit patterns.

EP4 Performance

Unlike EP1, where the $Z[n_2]$ array was simply stored into output e2.Z, the EP4 requires fixed-radix R. (or small factors of Ri) coding for at least some of the symbols $Z_i$. This can require multiplications and divisions, so it is more expensive. At the same time, EP4 operates on larger blocks of bits at a time, which goes in its favor. Therefore, a pump efficiencies are not related as directly to EP performance gains as in the comparisons among the EP1, EP2, and EP3 methods. EP4's single-cycle efficiency is the ratio between the encoded size of Z and the entropy H(S) (cf. eq. (15)):

$$f(p, d) = m \sum_{c=0}^{d} p^c q^{d-c} \log\binom{d}{c} \bigg/ n h(p) \qquad (55)$$

$$= \sum_{c=0}^{d} p^c q^{d-c} \log\binom{d}{c} \bigg/ d h(p)$$

The most-practical block sizes d are powers of 2 since for $d = 2^k$ the binomial coefficients C(d,c) have only few small (<d) prime factors, after dividing out factors 2 (see table below), allowing for efficient pre-computed-table-based fixed-radix coding of Z (since only fixed radices equal to the distinct prime factors of C(d,c) are needed).

| d | Prime Factors ($\neq$ 2) of C(d, c) | | | | | | | |
|---|---|---|---|---|---|---|---|---|
| 4 | 3 | | | | | | | |
| 8 | 5 | 7 | | | | | | |
| 16 | 3 | 5 | 7 | 11 | 13 | | | |
| 32 | 3 | 5 | 7 | 13 | 17 | 19 | 23 | 29 | 31 |

FIG. 21 shows the single-cycle EP4 pump efficiencies (in percents) f(p,d) for several block sizes d and probabilities p (in percents).

Multicycle EP4 Variants

The multicycle EP extensions, such EP2 and EP3, work exactly the same way for the general block size d since the EP cycles affect only the higher-level coding logistics of and output layouts from multiple elemental single cycle EPs, while the block length d affects the low-level coding tasks within EP1. The only difference is that the binarization steps of EP2 and EP3 will produce d>2 binary components instead of only two, X and Y, for d=2 case. This means that theΓ tree is d-ary instead of binary. Since, as FIG. 20 shows, the EP4 efficiencies for the block sizes of practical interest (d=8, 16, 32, 64, 128 bits) are already quite high (e.g. at p=25%, f (p) ranges from 64% to 95%), the multiple-cycle extensions of EP4 are not as useful as those of EP1.

QI/EC Modeling of Markov Sources

A Markov source of order r ("M|r") is a probabilistic source for which the probabilities of the next symbol are determined by the value of the previous r symbols. A Bernoulli source is an order 0, or (M|0), source.

The type of source considered in this section is also called Finite Context (FC) source. A more general Markov source is a Finite State (FS) source, of which FC sources are a special case. Since FC provides a more-concrete model description, we use it to present our Markov modeling, even though the present invention's teachings work the same way for general FS sources (but require a more elaborate notation). In this section, moreover, we also restrict consideration to stationary Markov sources (whereas a subsequent section on general probabilistic modelers removes this restriction).

Our input sequence generated by M|r is $S \equiv S[n] \equiv \alpha_1 \alpha_2 \ldots \alpha_n$, where the $\alpha_i$'s belong to an alphabet $A = [0, \alpha]$ of size $\alpha$. The M|r property of S[n] for the $i^{th}$ symbol can be expressed in a conditional-probabilities notation P(Event|Condition):

$$P_{M|r}(\alpha_i) \equiv P(r, \alpha_i) = P(\alpha_i | \alpha_{i-1} \alpha_{i-2} \ldots \alpha_{i-r}), \quad (60)$$

which says that the probability for $i^{th}$ symbol to have some value $\alpha_i \in A$ is a function of r+1 variables: $\alpha_i$ and the r symbols $\alpha_{i-1}, \alpha_{i-2} \ldots \alpha_{i-r}$ that precede $\alpha_i$ in S[n].

In many practical instances of M|r the "r preceding symbols $\alpha_i$" are interpreted as "some r symbols" with indices lower than i, but which are not necessarily the symbols immediately preceding $\alpha_i$ in S[n]. For example, in image compression the "r preceding symbols" are only spatially adjacent to the pixel $\alpha_i$ in two dimensions, but they are not adjacent to $\alpha_i$ in the one-dimensional image representation S[n].

We call this r-symbol sequence "preceding" $\alpha_i$ the r-context $C(r, \alpha_i) \equiv C(\alpha_i) \equiv C_i \equiv c_1 c_2 \ldots c_r$ of $\alpha_i$:

$$\ldots \underbrace{\alpha_{i-r} \alpha_{i-r+1} \cdots \alpha_{i-2} \alpha_{i-1}}_{C(r, \alpha_i)} \, \alpha_i \ldots \quad (61a)$$

$$c_r \, c_{r-1} \cdots c_2 \, c_1 \quad (61b)$$

While the definition (60) of M|r is unambiguous within the infinite-sequence source parameterization of conventional probabilistic modeling, it is ambiguous within the finite-sequence parameterization the of QI/EC modeling. Specifically, for a finite sequence S[n] we also need to specify boundary/initial conditions at the ends of the array S[n]. In this case we need to specify the results of (60) for i<r, where some sequence subscripts, such as i-r, become invalid. We will use a periodic-boundary-conditions convention, in which the copies $S_-[n]$, $S^+[n]$ of S[n] are assumed to be repeated before and after S[n]:

$$\ldots | \Box S_-[n] \to | \leftarrow S[n] \to | \leftarrow S_+[n] \to | \ldots \alpha_1 \alpha_2 \ldots$$
$$\alpha_{n-3} \alpha_{n-2} \alpha_{n-1} \alpha_n \alpha_1 \alpha_2 \alpha_3 \ldots \alpha_{n-1} \alpha_1 \alpha_2 \ldots$$
$$\alpha_{n-3} \alpha_{n-2} \alpha_{n-1} \alpha_n \quad (62)$$

Therefore, in this convention the M|r probabilities for $\alpha_1$ are defined by the r-context consisting of the last r characters of S[n]:

$$C(r, \alpha_1) = \alpha_{n-r+1} \alpha_{n-r+2} \ldots \alpha_{n-1} \alpha_n \quad (63)$$

This convention is equivalent to viewing S[n] as a cyclic array, wi$^{th}$ $\alpha_{n+1}$ "wrapping back" as $\alpha_1$.

Combinatorial Properties of Contexts

CP1. Array $C \equiv C[m] \equiv C'[m] \equiv \{C_u : u = 1 \ldots m\}$ is a sequence of all unique r-contexts in S[n]. Since the number of all r-contexts $C(r, \alpha_i)$ (for i=1 ... n) in S[n] is n, the number of unique contexts m is constrained as:

$$1 \leq m \leq n \quad (64)$$

CP2. An implication of eq. (60) relevant for the EC/QI modeling of M|r is that for any fixed context $C = c_1 c_2 \ldots c_r$ the probabilities $P(\alpha|C)$ for all $\alpha \in A$ are fixed through all occurrences of context C in S[n]. Therefore, the sequence $B_c \equiv B_c[n_c] \equiv b_1 b_2 \ldots b_{n_c}$ of symbols that follow the $1^{st}$, $2^{nd}$, ... $n_c^{th}$ occurrences of C in S[n] is an M|0 sequence (where $n_c$ is the total number of occurrences of C in S[n]). $B_c$ is therefore an element of an enumerative class $E_c$ consisting of all strings $W_c \equiv W[n_c]$ which have the same array of symbol counts $K(W_c) \equiv K_c[\alpha] \equiv K_c \equiv (k_0, k_1, \ldots k_{\alpha-1})$ as the sequence $B_c$:

$$E_c = \{\text{all } W_c : K(W_c) = K(B_c) \equiv (k_0, k_1, \ldots k_{\alpha-1})\}, \quad (65)$$

where $k_\alpha$ is the count of symbol $\alpha$ in $B_c$ (i.e. $k_\alpha \equiv K_c[\alpha]$). Since $k_0 + k_1 + \ldots + k_{\alpha-1} = n_c$, the size $|E_c|$ of the class $E_c$, which is multinomial, can be written as:

$$|E_c| = \binom{n_c}{k_0, k_1, \ldots k_{\alpha-1}} \equiv \frac{n_c!}{k_0! k_1! \cdots k_{\alpha-1}} \equiv M(n_c; k_0, k_1, \ldots k_{\alpha-1}) \quad (66)$$

(In the "Method of Types" the array of symbol counts K(S) of some sequence S is called "type of S." Hence, $E_c$ consists of all strings $W_c$ of the same "type" as $B_c$. Notethat enumerative classes $E_c$ are a combinatorial category distinct from "types." E.g., an enumerative class can include sequences whose symbol counts and lengths differ so long as those sequences are equally probable, i.e., have the same entropyp log(1/p). The two categories coincide only for order-0 stationary sequences.)

CP3. Since a sequence $\Sigma_c B_c$ that results from the concatenation all sequences $B_c$ for $C \in C$ contains all n symbols, exactly once each, of the original input array S[n], the counts $n_c$ satisfy:

$$\sum_{c \in C} n_c = n \quad (67)$$

CP4. Sequences $B_c$ along with the corresponding context strings $C \in C$ can be used to reconstruct not just n but the original sequence S[n] as well. To show this reconstruction, we define a working dictionary $\Delta$ whose entries (e.g. object-oriented-programming objects) S(C) contain context $C = c_1 c_2 \ldots c_r$ and the corresponding $S(C).B_c \equiv B_c$ (which contains sequence $b_1 b_2 \ldots b_{nc}$ and its length $n_c$) for all $C \in C[m]$. Given a context C, the dictionary $\Delta$ can retrieve (e.g., a pointer to) entry S(C). For convenience, each entry S(C) also contains a working variables $j \equiv S(C).j$, which represents the current position within $B_c$ (initialized as j=0). The following steps show reconstruction of S[n] from $\Delta$ and the starting context $C(r, \alpha_1)$ (cf. eq.(63)):

1. Set the current context $C = C(\alpha_1)$ and output index i=0
2. Retrieve S(C) (containing $B_c$ and count $j \equiv S(C).j$) from $\Delta$.
3. Get symbol $\alpha = B_c[j]$ and increment count S(C).j.
4. Output symbol $\alpha$ as: $S[i] = \alpha$, increment i and terminate if i=n.

5. Compute the next context $X=x_1 x_2 \ldots x_r$ from the current context $C=c_1 c_2 \ldots c_r$ by using the following mapping (i.e., by a right shift of C): $x_1 x_2 \ldots x_r \rightarrow \alpha\, c_1 c_2 \ldots c_{r-1}$.

6. Assign C=X and go to step 2.

CP5. While counts $k_\alpha \in K_c$ are simple counts of symbol $\alpha$ in $B_c$, they also count occurrences of (r+1)-symbol substrings D of S[n] as follows:

$$D \equiv D[s] \equiv D_{\alpha,c} = d_1 d_2 d_3 \ldots d_s \equiv \alpha\, c_1 c_2 \ldots c_r \quad (68)$$

where $s \equiv r+1$, $d_1 \equiv \alpha$, and, for $t=1 \ldots r$, $d_{1+t} \equiv c_t$.

$$\#d_1 d_2 \ldots d_s \equiv \#D_{\alpha,c} \equiv K_c[\alpha] = k_\alpha \text{ for } \alpha \in A \quad (69)$$

We call s-symbol substrings D of S[n] the s-grams of S[n] and denote their occurrence counts in S[n] by prefixing the string or its label with "#." (E.g., #abc is the count of the occurrences of abc in S). Hence the 1-gram #a is simply the symbol count of $\alpha$ in S[n].

(Here we interpret "substring of S[n]" under the cyclic boundary conditions (63) for S[n]; i.e., s-grams D may wrap around the ends of S[n]. In fields such as linguistics, biology, Internet search engines, etc., cyclic and non-cyclic s-grams are called "n-grams" or "q-grams" and are used extensively for data-mining large data sets.)

For an empty string $\phi$, the integer $\#\phi$ defines a count of 0-grams. We set by convention: $\#\phi \equiv n$. We also denote the set of all unique s-grams occurring in S[n] as $G \equiv G^s \equiv G^s(S)$ and the array of their corresponding counts as #G, wi$^{th}$ count #D of s-gram D retrieved as #D=#G[D]. (For brevity, we use array notation for #G[D] searches, but they would be typically be implemented in practice wi$^{th}$ hash tables, trees, etc.)

CP6. The objects G and #G can be constructed from the array (of unique contexts) C[m] and a set $\{K\} \equiv \{$arrays $K_c$ for all $C \in C[m]\}$. Specifically, for each $C=c_1 c_2 \ldots c_r \in C[m]$, we scan the corresponding array $K_c[\alpha] \in \{K\}$ for $\alpha = 0 \ldots \alpha - 1$, examining counts $k_\alpha = K_c[\alpha]$. For each nonzero count $k_\alpha$ found, we append s-gram $D \equiv \alpha\, c_1 c_2 \ldots c_r$ to G and the count $k_\alpha$ to #G.

CP7. Similarly, the objects C[m] and $\{K\}$ can be constructed from G and #G as follows: we split G into classes T, each class consisting of all s-grams $D \in G$ with the same r-symbol postfix $T(D)=d_2 d_3 \ldots d_s$. Hence, the s-grams $D \in T$ differ only in their first symbol $d_1$. We set context count m=0, loop through all classes $T \subset G$, and, for each T:

1. We assign T's common r-symbol postfix $T(D)=d_2 d_3 \ldots d_s \equiv C \equiv c_1 c_2 \ldots c_r$ to C[m] and increment the number m of unique r-contexts created so far.
2. We create array $K_c[\alpha]$ as a new element of $\{K\}$, set its values to 0. Then for each s-gram $D = d_1 d_2 \ldots d_s \in T$ we set $K_c[d_1]$ to the s-gram D count (which is the number #G[D] from the set #G).

The important consequence of the reconstructions (CP6, 7) for coding is that transmitting objects $\{C\}$ and $\{K\}$ costs exactly the same as transmitting objects G and #G. Since the latter two objects are simpler and algorithmically more convenient, we examine below some of their properties.

CP8. An upper bound can be determined for the size |G| of G (which is the same as the size |#G| of #G) by noting that G is a subset of a set $A^s \equiv A^s(\alpha)$ of all strings with s symbols from alphabet A of size $\alpha$. Therefore:

$$|G|=|\#G| \leq |A^s| = \alpha^s \quad (70a)$$

$$|G| \leq n \quad (70b)$$

$$s=1 \Rightarrow |G| \text{Min}\{n, \alpha\} \quad (70c)$$

CP9. The s-gram counts are constrained by the following hierarchy of linear equations:

$$\sum_{x=0}^{\alpha-1} \#x a_1 a_2 \cdots a_t = \#a_1 a_2 \cdots a_t = \sum_{x=0}^{\alpha-1} \#a_1 a_2 \cdots a_t x \quad (71)$$

Eqs. (71) follow from considering how the counts $A \equiv \#\alpha_1 \alpha_2 \ldots \alpha_t$ and $B[x] \equiv \#\alpha_1 \alpha_2 \ldots \alpha_t x$ (for $x=0 \ldots \alpha-1$) are computed, namely by stepping through the cyclic string S[n]'s symbols, keeping track of the last t symbols L[t] in each step. Whenever $L[t]=\alpha_1 \alpha_2 \ldots \alpha_t$, we increment counter A and one of the counters B[x], using the value of the symbol x that follows $\alpha_t$ as the index for the B[x] counters. Therefore, the sum of the B[x] counters (right side sum in (71)) is the same as the A counter (middle term in (71)). For the left side sum in (71), we use the symbol x that preceded a1 as the index for the B[x] counter, with the same conclusion.

Eqs. (71) hold for any $t=0, 1, \ldots n-1$ and any sequence $\alpha_1 \alpha_2 \ldots \alpha_t$. For t=0, the left and right sums in (71) become $\Sigma_x \#x = \#\phi \equiv n$. So our 0-gram convention $\#\phi \equiv n$ for the count of the empty substring $\phi$ agrees with the sum of 1-grams #x, since values #x are the counts of symbol x (where $x=0, 1, \ldots \alpha-1$) in S[n], so the sum all #x is also n.

Example: s=2, $\alpha=2$. Parameter t in (71) can be 0 or 1. Since t=0 was already discussed for the general case, the remaining value t=1 in (71) yields the equations:

$$\#0\alpha + \#1\alpha = \#\alpha = \#\alpha 0 + \alpha 1, \text{ for } \alpha=0,1,$$

which produce a single independent constraint: #01=#10, i.e. the numbers of substrings 01 and 10 must be the same (using cyclic boundary conditions of eq. (62)). Since there are four 2-gram counts #00, #01, #10 and #11, we need to transmit only 3 independent numbers: #00, #01 and #11 to specify #G (which in turn implies G).

MS1: Modeling Markov Source of Known Order r

The M|r case of known order r and possibly unknown probabilities $P(\alpha \in A | C \in C)$ is of practical importance since we often know the relevant range of a context influencing the next symbol, although we may not know the exact degree of that influence (e.g. in image compression, we may know in advance the size of the relevant pixel neighborhood but not its quantitative effects on the pixel value).

Encoding

1) Create an empty context dictionary $\Delta$ with functionality to add new contexts (pointers to what we will call "context state") to $\Delta$, to check whether a context C is in $\Delta$ and if found return its state S(C), and finally to extract the list of all S(C) in $\Delta$. The context state S(C) includes an output array for the enumerative index $I(B_c)$ within the class $E_c$ (of the array $B_c$ for that context), along with the necessary QI/EC coding state variables, the array $K_c$, and miscellaneous state variables. We denote any variable x local to S(C) as S(C).x.

2) Set the "current context" $C=C(\alpha_1)$ and loop for $i=1, 2, \ldots, n-r$) through the following steps:

a. If C is not in $\Delta$, we create new context state S(C) and add it to $\Delta$. Otherwise, we retrieve S(C) from $\Delta$. The new-S(C) constructor allocates space for arrays $K_c$ and $I(B_c)$, clears both arrays, and sets integer counters (e.g. $n_c$) to 0. It initializes EC/QI coder variables for encoding $B_c$ into $I(B_c)$.

b. We read the next input symbol $\alpha_i = S[i]$ and increment the counts $K_c[\alpha_i]$ and $n_c \equiv S(C).n_c$. With QI's colex enumeration, we encode here the symbol $\alpha_i$ into the output index $I(B_c)$ (i.e., without accumulating $B_c$ at all).

c. From $C=c_1 c_2 \ldots c_r$ and $\alpha_i$ we form the next context $X=x_1 x_2 \ldots x_r$ via mapping: $x_1 x_2 \ldots x_r \kappa \alpha_i c_1 c_2 \ldots c_{r-1}$.

d. We increment i and if ($i \leq n-r$) we update the current state as $C \square X$ and go back to step (a). Otherwise (when $i=n-r+1$) we terminate the loop.

3) Extract from dictionary $\Delta$ the full list C[m] of m unique contexts C (with associated context state objects S(C)).

4) For each $B_c$, the accumulated symbol counts $K(B_c) \equiv K_c[\alpha] \equiv (k_0, k_1, \ldots, k_{\alpha-1})$, identify the enumerative class $E_c$ to which $B_c$ belongs and with respect to which the index $I_c(B_c)$ is computed in step (2.b). The output size of $I_c$ is obtained from:

$$0 \leq I_c \leq |E_c|-1 = M(n_c; k_0, k_1, \ldots k_{\alpha-1})-1 \qquad (72)$$

The bit-fraction packaging of the sequence of indices $I_c$ is done as described in Appendix B. The output is a component TMR-TH(I[m]), where I[m] is the sequence of m indices and QMR(I[m]) is its mixed radix code (App. B).

5) Encode the class tags $T=T_1 T_2 \ldots T_m$, that indicate the sequence of $E_c$'s to be used by decoder to unrank the sequence of indices $I_c$ and reconstruct arrays $B_c$. The unencoded class tags here are the m count arrays $K_c$. Recalling the S[n] reconstruction (see (CP4)) from the unique contexts array C[m] and the set $\{K\}$ of associated counts arrays $K_c$, we need to send C[m] and $\{K\}$. Since, by (CP7), the combined information of C[m] and $\{K\}$ is the same as that of set G (of all unique s-grams encountered) and #G (the counts of the s-grams from G), and since the former pair can be computed from the latter (via CP7), we encode G and #G. The MS1 output thus consists of encoded components: e1.G, e1.#G, and e2.QMR(I[m]). (Numerous techniques exist for n-gram coding from various fields, including those developed for PPM implementations for use with AC. The choice of n-gram coding algorithm depends on the type of inputs.)

Decoding

1. The decoder expands the s-grams G and their counts #G from e1.G, e1.#G

2. Using algorithm (CP7), the decoder computes from G and #G the context array C[m] and the set $\{K\}$ of corresponding KC (symbol counts of $B_c$) arrays.

3. From e2.QMR(I[m]), the mixed-radix decoder of Appendix B decodes the sequence I[m] of indices IC (for $B_c$ sequences).

4. From each pair $K_c$ (from step #2) and $I_c$, the decoder unranks sequence $B_c$ for all $C \in C[m]$.

5. From the set of $B_c$'s and the corresponding contexts $C \in C[m]$, the decoder computes the input sequence S[n] using the CP4 algorithm.

Use of General Probabilistic Models by QI/EC

General probabilistic models (GPM) are a generalization of Markov M|r models in which the probability distribution $P(\alpha_i)$ of the next symbol $\alpha_i$ of the input sequence S[n] depends on the entire preceding section of the sequence, its symbols, and the position i for which the prediction is being made. Hence, eq. (60) characterizing Markov source M|r is replaced by a more general functional dependency:

$$P_{GPM}(\alpha_i) \equiv P(\alpha_i) = P(\alpha_{i-1} \alpha_{i-2} \ldots \alpha_1) \equiv P(\alpha_i | C_{i-1}) \qquad (80)$$

The conditional probability in (80) is a general function of $i-1$ variables $\alpha_j$ for $j=1 \ldots i-1$. But GPM also introduces an assumption (i.e., a restriction) that was not present in the M|r models: GPM assumes that the coder and decoder know the $P(\alpha_i | C_{i-1})$ function. This is an assumption we did not make for M|r models. (We assumed only that the coder knows the model order r.)

In the finite-sequence setting, where the full sequence length is also given, our periodic (cyclic) boundary conditions can express eq. (80) as a special case of the M|n model, i.e., of a Markov model with a fixed-length r context, where r equals the length n of S[n]:

$$P_{M|n}(\alpha_i) \equiv P(\alpha_i) = P(\alpha_i | \alpha_{i-1} \alpha_{1-2} \ldots \alpha_{i-n}) \qquad (81)$$

with an additional "predictive modeling" restriction on the n-parameter function $P(\alpha_i | C_n)$ in (81): the GPM case of M|n in (81) ignores the parameters $\alpha_j$ in (81) for $j \geq i$. The general M|n modeler (81) for finite sequences takes these ignored parameters into account. Therefore, our M|r discussion and algorithms from the previous section apply for GPM as well. Since GPM has an additional restriction—the probabilities $P(\alpha_i)$ are assumed to be known to encoder/decoder—the QI/EC coder for a GPM source can make use of this restriction and improve coding efficiency and speed.

The GPM-form QI/EC modeling algorithm constructs enumerative classes $E_c$ by using the function $P(\alpha_i | C_{i-1})$. This results in the following algorithm.

GPM1: QI/EC GPM Modeler a) We define an interval called range $R_i$ of function $P(\alpha_i | C_{i-1})$ as follows:

$$R_i \equiv [P_0(i)] \equiv [P_0, P_0 + \Delta R(i)), \qquad (82)$$

where:

$$P_0(i) \equiv P_0 \equiv \text{Min } \{P(\alpha_i) : \alpha_i \in [0, \alpha)\} \qquad (83)$$

$$P_1(i) \equiv P_1 \equiv \text{Max } \{P(\alpha_i) : \alpha_i \in [0, \alpha)\}$$

$$\Delta R(i) \equiv \Delta R \equiv P_1(i) - P_0(i)$$

b) We partition range $R_i$ into $m = m(i | C_{i-1})$ sections (non-overlapping subintervals) denoted as:

$$D_j \equiv [d_j, d_j + \Delta_j) \text{ for } j=1 \ldots m, \qquad (84)$$

where:

$$d_{j+1} = d_j + \Delta_j \text{ for } j=1 \ldots m-1 \text{ and } d_1 = P_0 \qquad (85)$$

and where $d_j$ and $\Delta_j$ are functions of i and $C_{i-1}$ (just as m is).

The values m and $\Delta_j$ are selected to be "small" with respect to $\Delta R(i)$, such as:

$$m = \sqrt{n} \qquad (86)$$

$$\Delta_j = \delta = \Delta R / \sqrt{n}. \qquad (87)$$

which yields equal subintervals of $R_i$:

$$D_j = [P_0 + (j-1) \cdot \delta, P_0 + j \cdot \delta) \qquad (88)$$

c) We maintain m output blocks $B_1 B_2 \ldots B_m$ and send "next symbol" $\alpha_i$ to block $B_j$, where j is defined by the subinterval $D_j$ containing GPM prediction $P(\alpha_i | C_{i-1})$.

d) Since each $B_j$ will contain symbols $\alpha_i$ that are approximately equiprobable, the block $B_j$ belongs to enumerative class $E_j$ consisting of all symbol sequences W that have the same symbol counts $K(W) \equiv (k_0, k_1, \ldots k_{\alpha-1})$ as $B_j$ (cf. eq. (65)):

$$E_j = \{\text{all } W: K(W) = K(B_j) \equiv (k_0, k_1, \ldots k_{\alpha-1})\} \qquad (89)$$

The encoding/decoding logistics of $B_j$ are similar to those of the MS1 algorithm for the M|r models (of which the GPM is special in finite sequence formulation of M|n).

The GPM1 redundancy per symbol ($\delta H$) depends on the probability errors $\delta P$, which are upper bound by the sizes $\Delta_j$ of the subintervals $D_j$. The general form of this dependency in the limit of $\delta P \to 0$ is:

$$\delta H = \sum_{a=0}^{\alpha-1} \frac{\delta P(a)^2}{P(a)} = \sum_{a_i=0}^{\alpha-1} \frac{\Delta_j^2(a_i)}{d_j(a_i)} \approx O\left(\frac{\alpha}{n}\right), \quad (90)$$

where we have used eq. (87) to estimate the asymptotic value of $\Delta H$ for $n \to \infty$. This estimated $\delta H$ is of the same order as the effects of typical sampling error on symbol statistics.

Appendix B: Bit-Fraction Removal via Mixed-Radix Coding

As was mentioned above, it will often be the case that the outputs described above will be subjected to operations such as mixed-radix encoding to eliminate the loss that results from the need to transmit in whole numbers of bits. This appendix describes sample approaches that can be used for this purpose.

The input for mixed radix ("MR") coding is a sequence $A \equiv A[n] = a_1 a_2 \ldots a_n$, where "digits" $\alpha_i$ are integers constrained via integer "radices" $R_i$ as:

$$0 \leq \alpha_i < R_i \text{ for } i=1,2,\ldots n \quad (B.1)$$

The MR coder also assumes that for each digit $\alpha_i$ all its values consistent with constraint (B.1) are equiprobable (i.e. A is a high-entropy-limit/maximum-entropy sequence). The exact enumerative coding ("EC") of A produces an integer (index) I(A) computed as follows:

$$I(A) = \alpha_1 V_0 + \alpha_2 V_1 + \alpha_3 V_2 + \ldots + \alpha_n V_{n-1}, \quad (B.2)$$

where:

$$V_0 \equiv 1, V_1 \equiv R_1, V_2 \equiv R_1 R_2, \ldots, V_n \equiv R_1 R_2 \ldots R_n \quad (B.3)$$

For different n digit sequences A satisfying (B.1), the index I(A) takes $V_n$ distinct values 0, 1, … $V_n-1$ and all these values of I are equally probable. The quantities $V_i$ that (B.3) defines are called enumerative volumes (or radix powers in the fixed-radix case: $R_i = R$ for $i=1 \ldots n$, since volumes $V_i$ become regular i-th powers of the common radix R: $V_i = R^i$ for $i=0 \ldots n$). The problem with index computation (B.2) is that it quickly becomes impractical because the required arithmetic precision increases with n.

Quantized Indexing ("QI") solves EC's precision problem by replacing exact volumes $V_i$ with quantized volumes $Q_i$, which are of special numeric type called sliding-window ("SW") integers). An SW integer $Q = SW(g,w,s)$ is an integer defined via three integer parameters g (precision), w (mantissa) and s (exponent), with w limited to g bits, as follows:

$$Q = SW(g, w, s) \equiv (w,s) = w \cdot 2^s \quad (B.4)$$

where:

$$0 \leq w < 2^g \text{ and for } s > 0 \Rightarrow 2^{g-1} \leq w < 2^g \quad (B.5)$$

Function SW(g,w,s) is abbreviated in (B.4) as (w,s) to indicate that, in a given context g is normally fixed and can therefore can be left implicit. Note also that SW normalization in eq. (B.5) applies only to Q-SW(g,ws) integers for which the exponent s is nonzero. This differs from ordinary floating-point ("FP") number, where the exponent would go negative to enforce the mantissa-range requirement.

We can depict a quantized integer graphically thus:

$$Q = SW(g, w, s) = \overbrace{1xx\cdots x}^{g\text{-bit }w} \times \overbrace{0000\cdots 0000}^{s\text{ bits}} \text{ for } (s > 0) \quad (B.6)$$

Although SW integers are similar in form to floating point (FP) numbers, SW arithmetic is exact integer arithmetic; unlike FP arithmetic, SW arithmetic operations are decoupled from rounding. With SW integers, the rounding is a separate operator $[X]_{sw}$ applicable to general integers X:

$$Q = [X]_{sw} \Rightarrow Q = \text{Min}\{SW(g,w,s) \geq X, \text{ for all } w,s\} \quad (B.7)$$

In words, SW rounding $[X]_{sw}$ is rounding up to the nearest g-bit SW integer $Q \geq x$.

QI Mixed Radix coding (QMR) replaces (B.2)-(B.3) with $$I(A) = \alpha_1 Q_0 + \alpha_2 Q_1 + \alpha_3 Q_2 + \ldots + \alpha_n Q_{n-1} \quad (B.8)$$

where:

$$Q_0 \equiv 1, Q_1 \equiv [R_1]_{sw}, Q_2 \equiv [Q_1 R_2]_{sw}, \ldots, Q_n \equiv [Q_{n-1} R_n]_{sw} \quad (B.9a)$$

or $$Q_0 \equiv 1, Q_i \equiv [Q_{i-1} R_i]_{sw} \text{ for } i=1 \ldots n \quad (B.9b)$$

The operands of the multiplications in eqs. (B8-9) are merely integers whose lengths are only g bits (where g is usually a register size, such as g=32). This is unlike eqs. (B2-3), where one integer is of the size of output I (i.e. one operand has O(log(I)) bits). Since the index values I are limited as:

$$0 \leq I \leq Q_n - 1 \equiv I_{max}, \quad (B.10)$$

and since all I values, being equally probable, are encoded in a fixed number of bits Oust large enough to fit Imax), the QMR output length in bits, L(I), is (with $Q_n \equiv (w,s)$):

$$L(I) = \lfloor \log(Q_n - 1) \rfloor + 1 = \lfloor \log(w-1) \rfloor + s + 1 = L(w-1) + s \quad (B.11)$$

The output redundancy $\delta(g)$ (in bits per input symbol), resulting from the limited g-bit SW mantissa precision, is upper-bounded as follows:

$$\delta(g) \equiv [L(I_{QMR}) - L(I_{MR})]/n < \frac{1}{2}^{g-1} \text{ bits/symbol} \quad (B.12)$$

Block Bit-Fraction Removal

Bit faction loss occurs for sequences of blocks $B = B_1 B_2 \ldots B_n$ where each block contains bit patterns restricted in a particular way: if the bit patterns are interpreted as integers $N_i$ for blocks $B_i$ (in some high-low bit order convention for a block), then:

$$0 \leq N_i < M_i \text{ for } i=1 \ldots n \quad (B.13)$$

where decoder "knows" the bounds $M_i$ and where the $M_i$'s have the following properties:

a) Integers $M_i$ are the lowest integer bounds on patterns in $B_i$, i.e., $$0 \leq N_i \leq M_i - 1 \quad (B.14)$$

b) The values for $N_i$ are distributed uniformly in the interval $[0, M_i)$.

(Note that the lower bound 0 of $N_i$ in (B.13-14) is a convention; i.e., if the lower bound for $N_i$ is integer $L_i > 0$, then we define some new integers $N_i' = N_i - L_i$ and $M_i' = M_i - L_i$ so that (B.13) holds for $N_i'$ and $M_i'$.)

The minimum whole number of bits $L_i$ that can fit any $N_i$ satisfying (a) is:

$$L_i = \lfloor \log(M_i-1) \rfloor + 1 \qquad (B.15)$$

which for $M_i = 2^c$, yields $L_i = c$. If we store $B_i$ in $L_i$ whole bits, then the bit-faction loss is $\delta_i = L_i - \log(M_i)$, and $\delta_i > 0$ for $M_i$ that are not powers of 2, i.e., for:

$$2^{L_i-1} < M_i < 2^{L_i} \qquad (B.16)$$

because the bit patterns of all integers in the interval $[M_i, 2^{L_i})$ are unused. So we assume that all blocks $B_i$ of interest here satisfy (B.16).

When there is only a single block B with properties (a)-(b), one can partially remove the bit-fraction loss $\delta = L - \log(M)$ (we drop subscript i) via Tapered Huffman (TH) codes as follows:

TH.1) Encode $n_0 \equiv 2^L - M$ values of N using $L-1$ bits per value.

TH.2) Encode $n_1 \equiv M - n_0 = 2 \cdot M - 2^L$ values of N using L bits per value.

The average length $\overline{N}$ of TH(N) codes and the average redundancy $\delta(M)$ are:

$$\overline{N} = [n_0(L-1) + n_1 L]/M = L + 1 - 2^L/M \qquad (B.17)$$

$$\delta(M) = \overline{N} - \log(M) \qquad (B.18)$$

For example, if $M=6$, we have $L = \lfloor \log(6-1) \rfloor + 1 = \lfloor 2.32 \rfloor + 1 = 3$, hence $n_0 = 2^3 - 6 = $ (the number of two-bit codes) and $n_1 = 6 - n_0 = 4$ (the # of three-bit codes). The TH(N) codes are:

| N | TH(N) |
|---|---|
| 0 | 00 |
| 1 | 01 |
| 2 | 110 |
| 3 | 101 |
| 4 | 110 |
| 5 | 111 |

The average code length $\overline{N} = 4 - 8/6 = 2.666$ bits, and the optimal length is $\log(6) = 2.585$ bits, so the average redundancy $\delta(6) = 0.0817$ bits/symbols, which is a 3.2% excess. The worst-TH-performance case (maximum $\delta$ for M satisfying B.16) occurs for the integer M nearest to the real number $M_0 = 2^L/\log(e) = 2^L/1.4427 \ldots \approx 2^L \cdot 2/3 \approx 2^L \cdot 192/277$, where the redundancy reaches its maximum $\delta(M_0) = 1 + \log(\log(e)) - \log(e) = 0.086071$ bits/symbol.

When there is more than one block (n>1) with such block bit fraction losses, the QMR method described here reduces the redundancy to $\delta_Q(n) < \delta(M_0)/n + \frac{1}{2}^{g-1}$ bits/symbol. We define SW integers $Q_i \equiv \lceil M_i \rceil_{sw}$ for $i = 1 \ldots n$, hence we have:

$$Q_i = (w_i, s_i) \equiv \lceil M_i \rceil_{sw} \geq M_i \geq N_i + 1 > N_i \qquad (B.19)$$

Recalling the SW integer representation (B.6) and using (B.19), we can express the bit patterns of $Q_i$, $Q_i - 1$ and $N_i$ as follows (bit significance increases from right to left):

$$Q_i = \overline{\underset{g\text{-bit } w_i}{xxx \cdots x} \; \underset{s_i \text{ bits}}{0000 \cdots 0000}} \qquad (B.20)$$

$$0 \leq N_i \leq Q_i - 1 = \overline{\underset{g\text{-bit } w_i-1}{yyy \cdots y} \; \underset{s_i \text{ bits}}{1111 \cdots 1111}}$$

$$N_i = \overline{\underset{\text{top } g \text{ bits}}{zzz \cdots z} \; \underset{s_i \text{ bit tail}}{tttt \cdots tttt}}$$

The bit patterns xx ... x and yy ... y in (B.20) represent integers $w_i$ and $w_i - 1$. Denoting the top g bits of $N_i$ (the pattern zz ... z in (B.20)) as $d_i$, the integers $d_i$ have properties:

$$0 \leq d_i \leq w_i - 1 < w_i, \qquad (B.21)$$

and values of $d_i$ are uniformly distributed in the interval $[0, w_i)$. Therefore we can encode the sequence $d_i$ taken as digits of an integer D in radices $R_i = w_i$ via QMR eqs. (B.8-9):

$$D = d_1 + d_2 U_1 + d_3 U_2 + \ldots + d_n U_{n-1} \qquad (B.22)$$

where:

$$U_0 \equiv 1, \; U_i \equiv \lceil U_{i-1} w_i \rceil_{sw} \text{ for } i = 1 \ldots n \qquad (B.23)$$

at a redundancy $\delta(g) < \frac{1}{2}^{g-1}$ bits per digit $d_i$. Since the $s_i$ tail bits $T_i$ of $N_i$ (denoted as pattern tt ... t in eq. (B.20)) are uniformly distributed in the interval $[0, 2^{s_i})$, their optimal encoding requires $s_i$ whole bits, so they need no further processing. The full redundancy per block introduced by QMR encoding is therefore $\delta(g) < \frac{1}{2}^{g-1}$ bits per block $B_i$. The resulting encoded output consists of QMR(B)=D $T_1 T_2 \ldots T_n$, where the length of D is determined via (B.11) from the value $U_n$ computed in (B.23).

Further, since the SW integer $U_n = (w_u, s_u)$ limits the maximum value of integer D as:

$$0 \leq D \leq U_n - 1 \qquad (B.24)$$

we obtain the following constraint on the top g bits of D (denoted here as integer d): by applying (B.20) to $U_n$ and D:

$$0 \leq d \leq w_u \qquad (B.25)$$

If the block sequence B is the sole coding task, which has to be transmitted in a whole number of bits, then we would encode the top g bits of D via a Tapered Huffman code, so our output would consist of sequence: QMR-TH(B)=TH(D) $T_1 T_2 \ldots T_n$.

If there are additional components, they could be e.g. included in the original sequence of locks B. Note also that eqs. (B.22-24) establish properties (a) & (b) for the entire output as a block of type $B_i$, the output can be included in further application of the same method hierarchically.

Decoding of QMR-TH(B) assumes that decoder knows the array of $M_i$ for $i = 1 \ldots n$, along with the block sizes. This is realistic in many applications, since blocks $B_i$ typically contain indices from some other coding sub-task, e.g., from a binary-QI-coder output, where the $M_i = Q_i$ is the top binomial coefficient for the ones count, which the decoder would have to know. The decoder computes $Q_i = (w_i, s_i) \equiv \lceil M_i \rceil_{sw}$ via (B.19) and computes sequence $U_i$ via (B.21). From $U_n = (w_u, s_u)$ it computes the length of D and decodes TH(D), which provides it a bit pointer into the sequence of tail bits $T_1 T_2 \ldots T_n$ of $B_1 B_2 \ldots B_n$. A QMR decoder then decodes D into a sequence of digits $d_1 d_2 \ldots d_n$, which are then concatenated with the corresponding tail blocks $T_i$. The length of each tail block $T_i$ and the number of bits from the 'top g bits' of $B_i$ is known to decoder from the knowledge of $Q_i$ (cf. eq. (B.20)). (The number of bits in the "top g bits" may be less than g bits if the $Q_i = (w_i, s_i)$ has $s_i = 0$, so $w_i$ may have fewer than g siginficant bits. The number of bits assigned to $d_i < w_i$ is, via (B.20), the number of significant bits in $w_i - 1$.)

Hierarchical Radix Coding (HRC)

Although QMR coding (B8-9) reduces the coding work and the table-memory size of conventional mixed radix coding by a factor O(n), the memory use for the array of $Q_i$ values may still become a problem for large enough n. Specifically, while the QMR encoder can use recurrence (B.9b) without storing Qi's into an array (since the additions in (B.8) can be done in the same order as computations in (B.9): i=1,2, ... n), the QMR decoder uses $Q_i$'s in order i=n, n−1, ... 1, which is reverse from the recurrence (B.9), so the decoder needs to store all $Q_i$'s generated by (B.9) into an array of n SWI integers. The HRC method solves this problem of table space for large n if the radix is fixed or there are only a few distinct radices.

In the HRC method we assume a fixed radix for the input sequence A[n]:

$$R_i=R \text{ for } i=1 \ldots n \quad (B.26)$$

The table for quantized volumes $Q_i=[Q_{i-1}R]_{sw}$ requires space for n SWI entries. The two-level HRC method, presented first, reduces the table size to $\approx 2\sqrt{n}$ entries, while general k-level HRC variant reduces the table size to $\approx kn^{1/k}$ entries.

Two-Level HRC

Encoding a) We segment the input sequence A[n] into m blocks: $B=B_1 B_2 \ldots B_m$ of lengths (in symbols) $d_j$ for j=1 ... m−1. If we want to minimize the total table sizes, then the block lengths $d_j$ are selected such that $d_j$=d for j=1 ... m−1, and $d_m \leq d$, where, with $r \equiv \lfloor \sqrt{n} \rfloor$:

$$n-r^2 \leq r \Rightarrow m=r+1, d=r, d_m=n-r^2 \quad (B.26a)$$

$$n-r^2 > r \Rightarrow m=r+1, d=r, d_m=n-r^2-r \quad (B.26b)$$

b) We compute via eqs. (B8-9) the QMR indices $I[m] \equiv I_1, I_2, \ldots I_m$ for blocks $B_1 B_2 \ldots B_m$. Since the radix R is the same for all blocks and block sizes $d \leq r+1$, we need a single $Q_i$ table (from (B.9)) common to all blocks, and this table needs at most r+1 entries (for i=1 ... d). The maximum quantized volumes ($Q_n$ of eq. (B.8)) are the same SWI value $Q \equiv (w, s)$ for all blocks $B_i$, i=1 ... m−1, and possibly a different value $Q' \equiv (w', s')$ for the last block $B_m$, where $Q' \leq Q$.

c) Since the $I \equiv I_1, I_2, \ldots I_m$ have uniformly distributed values in the interval [0,Q) (or in [0,Q') for $I_m$), and the values Q and Q' are known to decoder, we can apply the QMR-TH(I) method of the previous section to sequence I[m], with blocks $I_1, I_2, \ldots I_m$. So we encode the "top g bits" $d_j$ of each index $I_j$ for j=1 ... m−1 by using radix w (the mantissa of Q), and we encode $d_m$ (for the last block) by using radix w' (mantissa of Q'). The table requirements for this computation are m SWI entries of eq. (B.9), which by (B.26) is limited to at most r+1 entries (the same as for step (b)).

Therefore, HRC encoding and decoding require two tables with at most r+1 SWI entries per table, which is $2\sqrt{n}+2$ entries instead of the n entries used by the direct QMR coding of A[n].

Decoding

The HRC decoder computes the m, d, and $d_m$ values via (B.26) and known n. Then it computes quantized volumes Q and Q' from the known radix R, d and $d_m$ via (B.9). With these it invokes the QMR-TH(I) decoder to reconstruct the index sequence $I[m] \equiv I_1, I_2, \ldots I_m B_j$ regular QMR it then decodes each of the indices $I_j$ back into the block $B_j$ (sequence of symbols in radix R), thereby recovering the original sequence A[n].

k-Level HRC

In general, one would define $r=\lfloor n^{1/k} \rfloor$, as for two-level HRC, and compute from n and r the number of blocks and block sizes. For the sake of brevity, though, we will consider the input length n which is a k-th power of an integer:

$$n=m^k \quad (B.27)$$

because, as we have seen in the k=2 case, the level of detail that results from observing $r=\lfloor n^{1/k} \rfloor$ merely makes the last block shorter without affecting the maximum table size (which is the topic of optimization here).

a) We split the input sequence A[n] into $m_1$ equal blocks $B_1(j_1)$, for $j_1=1 \ldots m_1$ with length (in symbols) d=m symbols per block. Hence there are $m_1=m^{k-1}$ blocks. We then encode each block via QMR, with radix R and block length m symbols. Since all blocks are of equal size and equal radix, we need only a single Q table (from eq. (B.9)) of m entries. We obtain $m_1$ indices $I1(j_1)$ for $j_1=1 \ldots m_1$. All indices have the same quantized upper bound $Q_i=(w_1,s_1)$ (which was denoted as $Q_n$ in eqs. (B.9), (B.20)).

b) With known upper bound $Q_i$ for indices, we can split each index $I_1(j_1)$ into the "top g bits," integer $d_1(j_1)$, and a block oftail bits $T_1(j_1)$. The latter is at maximum entropy, so it can be output without further encoding into a tail-sequence buffer (which accepts $m_1$ such tails). The $m_1=m^{k-1}$ integers $d_1(j_i)$ form a sequence of the A[n] type used in step (a) (equally probable symbols in a fixed radix), which, after the replacements $m_1=m^{k-1}=n/m \to n$ and $w_1 \to R$, is passed back to step (a), provided the new n exceeds unity. Otherwise, the encoding loop terminates.

The termination condition n=1 at the end of step (b) is reached after k executions of step (b), because each execution of (a) and (b) reduces the input n by factor m. Since step (a) requires a new m-entry Q table, the total number of tables at the termination is k, hence the total number of Q table entries is $k \cdot m \approx k \cdot n^{1/k}$. The table space reductionfactor f(k,n) is thus:

$$f(k,n)=n/(k \cdot n^{1/k})=n^{1-1/k}/k \quad (B.28)$$

which achieves its maximum for $k=[L+(L^2-4L)^{1/2}]/2$, where L=ln(n).

Mixed Radix HRC

The table-space savings of the HRC methods above was based on the reuse of the same $Q_i$ tables for different blocks (which also resulted in the same limits on the "top g bits" of block indices, which allowed for hierarchical reuse). While a fixed radix for the entire input A[n] is a sufficient condition for such table reusability, it is not a necessary one; i.e., the tables may be reusable even for variable radices, provided the radix variations are repeated from block to block. For example, A[n] may have radices $R_i$ which is simply flip between two (or among a few) values in accordance with whether i is even or odd, and the previous HRC methods would still work (with minor extra attention in setting the block sizes).

But such a convenient radix variation is not a general attribute of arrays A[n], so we now present a method that enables an HRC coder to extend the previous HRC methods' usefulness greatly. We note first that in this coding setup the coder and decoder know the radices $R_i$ (which now may vary for i=1 ... n). Now consider a variant of the above-mentioned even/odd-radix-regularity example, but allow there to be two radices $R_1$ and $R_2$ that vary in some fashion that is apparently random but is known to de/coder in any given coding instance.

The solution for this case is to have a convention between coder and decoder on how to permute the input array A[n]

in accordance with the radix values $R_i$ in the given coding instance (or with any other information about the input array that may make the permutation construction simpler). In the "random" (but known) $R_1$ and $R_2$ switches, this convention could be to separate the coding task, coding $R_1$ symbols as an input array $A_1[n_1]$ and $R_2$ symbols as an input array $A_2[n_2]$, where n, and n2 are counts of occurrences of $R_1$ and $R_2$ symbols (which decoder knows and therefore knows how to find the boundary between $A_1$ and $A_2$).

Appendix C: Removing SWI Exponents from QI Tables

It will often be advantageous to use quantized-index-type enumerative coding, described in my previous application, for one or more of the entropy-coding operations. As that application indicates, the addends used in that type of coding will ordinarily have been pre-computed and placed in tables. This appendix describes a way of reducing the sizes of the required tables.

The QI tables of quantized enumerative addends use SW integers (cf. eq. (B4)) for table entries. In many cases the explicit formulas for enumerative addends within the exact enumerative coding (EC) are also known. The examples of such cases include is quantized binomials for binary and multi-alphabet coders, quantized powers for fixed radix coder, quantized factorials for permutation coders, quantized radix products for mixed radix coders, quantized Ballot and Catalan numbers for tree coders, etc. The RXL method below utilizes these formulas (which may be exact or approximate) to compute SWI exponents from the integer parts of the logs of addends. The essential aspect of these addend formulas used by RXL is that their interpolation tables grow at slower a rate with n than the existent addend tables.

The present ("RXL") method removes the SWI table entries' exponent fields and replaces them with much smaller global interpolation parameters (which apply to the entire table). In a typical QI implementation (optimized for speed), the SWI exponents and mantissas are 32-bit integers stored in a structure such as:

```
typedef unsigned int dword; // 32 bit unsigned
typedef struct __swi {
    dword m;      // SWI mantissa
    int e;        // SWI exponent
} SWI;
```

Removing the exponents therefore reduces the table sizes in half. For example, the table for quantized binomials whose maximum block size is n requires $n^2/4$ SWI entries. The RXL SWI-exponent replacement tables require n integers while removing $n^2/4$ integers (SWI.e fields) from the tables. For typical n=1024 to 4096, the space savings range from 1 to 16 MBytes of memory.

The basic idea of RXL is to compute the integer part of log(V), where V is the exact enumerative addend, as a replacement for the Q.e field of quantized addend Q (where Q is of type SWI, Code C.1). The mathematical basis for applicability of the RXL method is the relatively small quantization error $\delta(g)<\frac{1}{2}^{g-1}$ bits/symbol. Thus, for each iterative step that computes quantized addends Q, 0.5 on average is added to the integer in range $2^{31}$-$2^{32}$. In order for the exponent to be affected by such small addends (which gets incremented when the mantissa doubles), one would need on average more than $2^{30}$ additions of $\delta(g)$ errors. Of course, if mantissa is close to $2^{32}$, e.g. Q.m=0xFFFF,FFFF, even a single add of +1 will cause mantissa overflow and a need to increment the exponent. But such cases are easily recognized (since the resulting mantissa will be close to 0x8000,0000 after renormalization) and corrected, as the actual implementation below shows.

The Table set forth in FIGS. 22A-C shows the typical quantization errors for n=1024 and some values of k. It shows the mantissa errors due to quantization of binomials Q(n,k). The computation was done for n=1024 and various values of k.

Its QBC column gives the quantized binomial coefficient with the mantissa stated in hexadecimal and the exponent in decimal. The XBC column has the same format, but it lists binomial coefficients computed as accurately as is possible within the 53-bit precision of a C language double.

The columns dm16 and dm10 show differences QBC.mantissa-XBC.mantissa in hex and decimal. Exponents will always be normalized to the same value. The column ddm (delta dm) shows the difference between the current dm10 value and the one from the previous line.

The column Extra Bits shows the total excess bits for the block of size n due to the expansion of the mantissa. (The small fractional values may yield a whole bit difference in multi-block coding or even statistically on a single block). The column Gap shows, include asterisks next to the QBC mantissas that were rounded up from the immediate previous add of the binomials: C(n,k)=C(n-1,k)+C(n-1,k-1)

We examine RXL for the important case of quantized binomial coefficients. The exact addend V(n,k) for some number n of input bits processed and count k of one bits encountered so far is a binomial coefficient:

$$V(n,k) = \binom{n}{k} \equiv \frac{n!}{k!(n-k)!} \qquad (C.1)$$

$$\log(V(n,k)) = \log(n!) - \log(k!) - \log((n-k)!) \qquad (C.2)$$

From (C.2) it follows that we can compute the integer part of log(V) by using a single table of n integer entries, each entry containing logarithms of factorials F[i!], for i=1 ... n in fixed-point form. Since we are assuming an SWI implementation that uses integer mantissas normalized to fall between $2^{g-1}$ and $2^g$ (where g is the mantissa precision, usually g=32), as shown in eq. (B.5), while regular FP numbers normalize mantissa to fall between 0.5 and 1.0, we need to rescale the FP value by subtracting 32 from the FP exponent, as shown in the Code C.2 in FIG. 23, in order to obtain the SWI exponent from FP exponent, The code of FIG. 24 ("Code C.3") shows the computation of log(x!) in the fixed-point format used by the illustrated example. The fixed-point format reserves the low 12 bits (value XP32) of a 32-bit wide storage location (treated by the compiler as an integer) for the fractional part of log(x!) and it uses that location's upper 20 bits for log(x!)'s integer part. Code C.3 converts to the fixed-point format a value 1f[i], fetched from a table of log factorials stored in floating-point form, that had been computed in accordance with the following recurrence:

$lf[x]=\log(x!)=\log((x-1)!)+\log(x)=lf[x-1]+\log(x)$

The actual computation of the SWI exponent for quantized binomial Q(n,k) is shown in FIG. 25 ("Code C.4"). The macro BCLOG uses eq. (C.2) to compute the fixed point log(x!), then the macro EXP32 shifts out the fixed point fraction to get integer part of the FP exponent. It then rescales the FP number (to match SWI exponent bias) by subtracting 32 from the FP exponent. The overflow adjustments occur at the end of the macro, where the mantissa is checked against the overflow threshold via ((b).m< 0xFF000000), and the exponent is adjusted if the mantissa exceeds the threshold. Similarly, the fractional part of the fixed-point log(bc) is checked for its own overflow ((te&XP32M)>30), and the same adjustments are performed on the SWI exponent (b).e. Note that the test result of "no overflow" falls into the ++(b).e branch; i.e., the exponent was pre-adjusted (pre-decremented) for any overflow, then adjusted back if tests return that no overflow occurred.

The present invention enables entropy encoders and decoders to avoid a significant amount of computational cost. It therefore constitute a significant advance in the art.

What is claimed is:

1. For encoding a symbol sequence, a method comprising a sequence of at least one operation of which at least one is an entropy-pump operation, which includes:
   A) receiving as the operation's input a sequence of symbols drawn from a symbol alphabet;
   B) dividing the operation's input into a sequence of blocks whose values belong to a block-value dictionary such that the block-value dictionary's block values are so classified into enumerative classes that:
      i) at least one enumerative class includes more than one of the block values; and
      ii) a respective index value is so associated with each block value that belongs to an enumerative class to which more than one block value belongs that some block values that belong to different enumerative classes have the same index value but each block value's index value identifies it uniquely within the enumerative class to which it belongs:
   C) generating a classifying output component by an operation that, at least if a predetermined coding criterion is met, includes entropy encoding a coding input derived from a sequence of class identifiers that specify the enumerative-class sequence of enumerative classes to which successive blocks in the input sequence belong; and
   D) for each enumerative class that belongs to the class sequence to which more than one of the block value's dictionary values belongs, generating as an index output component a sequence of indexes of the values of the input sequence's successive blocks whose values belong to that enumerative class, the indexes being so associated with block values that some block values that belong to different enumerative classes have the same index value but each block value's index value identifies it uniquely within the enumerative class to which it belongs.

2. A method as defined in claim 1 further including a further entropy-pump operation, whose operation of entropy encoding includes the first-mentioned entropy-pump operation.

3. A method as defined in claim 1 wherein:
   A) the method further includes:
      i) assigning a block probability to each of a plurality of block values in a block-value dictionary; and
      ii) assigning to each of a plurality of enumerative classes a respective different probability range chosen from a set of disjoint probability ranges; and
   B) the classification of the block values into the enumerative classes is such that each block value belongs to the enumerative class associated with the probability range to which the probability associated that block value belongs.

4. A method as defined in claim 1 wherein:
   A) the class identifiers are prefix codes that identify the enumerative classes in the enumerative-class sequence; and
   B) the operation of entropy encoding the encoding input to generate the classifying output component comprises entropy coding each of at least one binary-decomposition component of a sequence of those prefix codes that specifies the enumerative-class sequence, wherein each such binary-decomposition component:
      i) is associated with a respective i-bit prefix included in a prefix code that represents a multiple-value enumerative class to which at least one of the sequence's blocks belongs, where i is a non-negative integer, and
      ii) includes, for each of the sequence's blocks that belongs to a multiple-value enumerative class whose prefix code includes that i-bit prefix, includes the (i+1)st bit the of the prefix code that represents the class to which that block belongs.

* * * * *